US 9,595,916 B2

(12) United States Patent
Suzuki et al.

(10) Patent No.: US 9,595,916 B2
(45) Date of Patent: *Mar. 14, 2017

(54) MAGNETORESISTIVE EFFECT OSCILLATOR

(71) Applicant: TDK CORPORATION, Tokyo (JP)

(72) Inventors: Tsuyoshi Suzuki, Tokyo (JP); Eiji Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,864

(22) Filed: Oct. 16, 2014

(65) Prior Publication Data

US 2015/0109062 A1    Apr. 23, 2015

(30) Foreign Application Priority Data

Oct. 17, 2013  (JP) .................................. 2013-216174
Oct. 7, 2014  (JP) .................................. 2014-206103

(51) Int. Cl.
*H03B 17/00*    (2006.01)
*H03B 15/00*    (2006.01)

(52) U.S. Cl.
CPC ........... *H03B 15/006* (2013.01); *H03B 15/00* (2013.01)

(58) Field of Classification Search
CPC .............................. H03B 15/00; H03B 15/006
USPC ....................... 331/3, 94.1, 5, 107 R, 108 C
See application file for complete search history.

(56) References Cited

U.S. PATENT DOCUMENTS 8,063,709 B2 * 11/2011 Firastrau ................ B82Y 25/00
                                                                            331/3
2013/0057356 A1 * 3/2013 Houssameddine ....... H03L 5/00
                                                                            331/177 R

FOREIGN PATENT DOCUMENTS

JP    A-2010-519760    6/2010
WO   WO 2008/101545 A1    8/2008

OTHER PUBLICATIONS

Franchin et al., "Current-Driven Dynamics of Domain Walls Constrained in Ferromagnetic Nanopillars," *Physical Review B*, vol. 78, 2008, pp. 1-8.
Feb. 23, 2016 Office Action issued in U.S. Appl. No. 14/515,948.
Aug. 28, 2015 Office Action issued in U.S. Appl. 14/515,948.

* cited by examiner

*Primary Examiner* — Richard Tan
(74) *Attorney, Agent, or Firm* — Oliff PLC

(57) ABSTRACT

A magnetoresistive effect oscillator is provided which can realize a rise or a fall of oscillation at a higher speed. In the magnetoresistive effect oscillator, at the rise, a current having a first current density, which is larger than a critical current density for oscillation, is applied, and thereafter a current having a second current density, which is less than the current density corresponding to the first current density and not less than the critical current density for oscillation, is applied such that the magnetoresistive effect element oscillates at a predetermined frequency. In the magnetoresistive effect oscillator, at the fall, starting from the state where a first current density is applied to hold the magnetoresistive effect element in an oscillating condition, a current having a second current density and having polarity reversed to that of the first current density is applied such that the oscillation disappears.

2 Claims, 43 Drawing Sheets

MAGNETORESISTIVE EFFECT OSCILLATOR

BACKGROUND

The present invention relates to a magnetoresistive effect oscillator.

A magnetoresistive effect oscillator is an oscillator utilizing precession of magnetization in a magnetic layer of a magnetoresistive effect element, the precession being generated upon application of a current to the magnetoresistive effect element. In recent years, studies on the magnetoresistive effect oscillator have been conducted intensively. Patent Literature (PTL) 1 proposes an operation method of operating the magnetoresistive effect oscillator at a low current density lower than a critical current density for oscillation.

CITATION LIST

Patent Literature

[PTL 1] Japanese Unexamined Patent Application Publication (Translation of PCT Application) No. 2010-519760

SUMMARY

However, when the proposed magnetoresistive effect oscillator is applied to communications, a problem may occur with an element response speed. In other words, if a time is taken for a rise or a fall of oscillation, there would be a problem that the magnetoresistive effect oscillator is not adaptable for high-speed communications.

The present invention has been made in view of the above-described situation, and an object of the present invention is to provide a magnetoresistive effect oscillator that can realize a rise or a fall of oscillation at a higher speed.

To achieve the above object, a magnetoresistive effect oscillator according to a first aspect of the present invention comprises a magnetoresistive effect element including a first magnetic layer, a second magnetic layer, and a spacer layer sandwiched between the first magnetic layer and the second magnetic layer, and a current applying unit that applies a current to the magnetoresistive effect element to make the magnetoresistive effect element oscillate at a predetermined oscillation frequency, wherein the current applying unit applies a current, which has a first current density larger than a critical current density for oscillation of the magnetoresistive effect element, to the magnetoresistive effect element, and then applies a current having a second current density, which is less than the first current density and not less than the critical current density for oscillation, to the magnetoresistive effect element such that the magnetoresistive effect element oscillates at the predetermined frequency, a direction of the current having the second current density being same as a direction of the current having the first current density. With the magnetoresistive effect oscillator according to the first aspect, a rise of the oscillation of the magnetoresistive effect element is sped up, and so a response speed is improved.

In the magnetoresistive effect oscillator according to a second aspect of the present invention, starting from a state of an operating point of the magnetoresistive effect element being in a region where only a static condition is stabilized, the current applying unit applies the current having the first current density to the magnetoresistive effect element.

In the magnetoresistive effect oscillator according to a third aspect of the present invention, in addition to the first aspect, starting from a state of applying a current having a third current density, which is not less than the critical current density for oscillation, to the magnetoresistive effect element such that an operating point of the magnetoresistive effect element is positioned in a region where only an oscillating condition is stabilized, the current applying unit applies the current having the first current density to the magnetoresistive effect element, and a direction of the current having the third current density is same as the direction of the current having the first current density, the second current density being larger than the third current density.

In the magnetoresistive effect oscillator according to a fourth aspect of the present invention, starting from a state of applying a current having a third current density to the magnetoresistive effect element such that an operating point of the magnetoresistive effect element is positioned in a region of bistability, the current applying unit applies the current having the first current density to the magnetoresistive effect element, a direction of the current having the third current density being same as the direction of the current having the first current density.

The magnetoresistive effect oscillator according to a fifth aspect of the present invention comprises a magnetoresistive effect element including a first magnetic layer, a second magnetic layer, and a spacer layer sandwiched between the first magnetic layer and the second magnetic layer, and a current applying unit that applies a current to the magnetoresistive effect element to make the magnetoresistive effect element oscillate at a predetermined oscillation frequency, wherein, starting from a state of applying a current having a first current density to the magnetoresistive effect element and holding the magnetoresistive effect element in an oscillating condition, the current applying unit applies a current, which has a second current density and flows in a direction reversed to a direction of the current having the first current density, to the magnetoresistive effect element such that oscillation of the magnetoresistive effect element disappears. With the magnetoresistive effect oscillator according to the fifth aspect, a fall of the oscillation of the magnetoresistive effect oscillator is sped up, and so a response speed is improved.

In the magnetoresistive effect oscillator according to a sixth aspect of the present invention, in addition to the first to fourth aspects, starting from a state of applying the current having the second current density to the magnetoresistive effect element and holding the magnetoresistive effect element in an oscillating condition, the current applying unit applies a current, which has a fourth current density and flows in a direction reversed to the direction of the current having the second current density, to the magnetoresistive effect element such that oscillation of the magnetoresistive effect element disappears. With the magnetoresistive effect oscillator according to the sixth aspect, a rise and a fall of the oscillation of the magnetoresistive effect element are sped up, and so a response speed is improved.

With the present invention, the magnetoresistive effect oscillator can be obtained which can realize a rise or a fall of oscillation at a higher speed.

DETAILED DESCRIPTION OF EMBODIMENTS

Embodiments of the present invention are described below with reference to the drawings. The following description discloses some of embodiments of the present invention by way of example, and the present invention is not limited to the embodiments described below. Insofar as embodiments involve the technical concept of the present invention, those embodiments also fall within the scope of the present invention. Individual components, combinations of those components, etc. in the following embodiments are merely illustrative, and addition, omission, replacement, and other alterations of the components are allowed within a scope not departing from the gist of the present invention.

(Embodiment 1)

Figure 1:
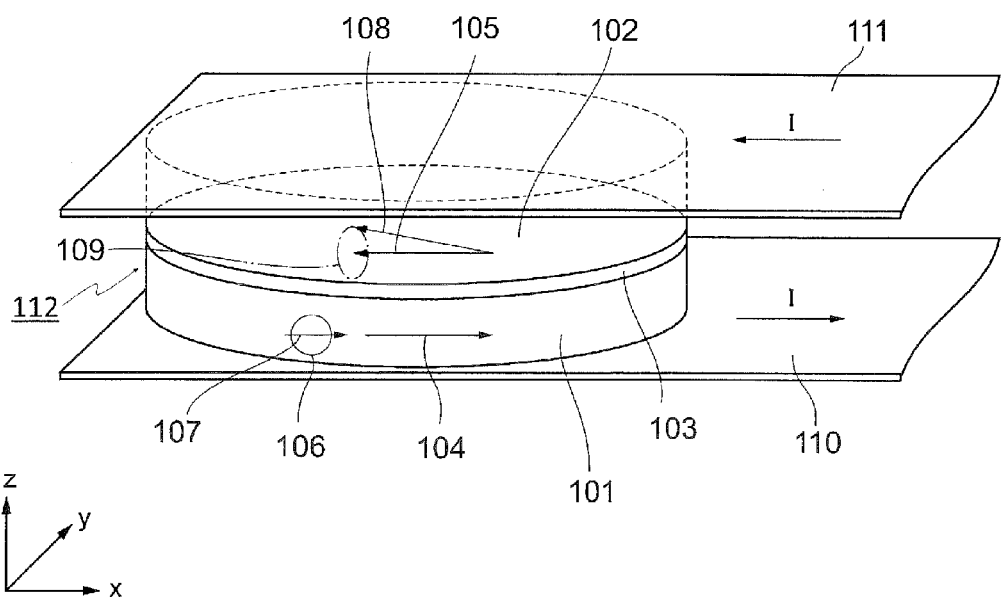
FIG. 1 is a schematic view of a magnetoresistive effect element according to Embodiment 1 of the present invention.
Figure 2A:
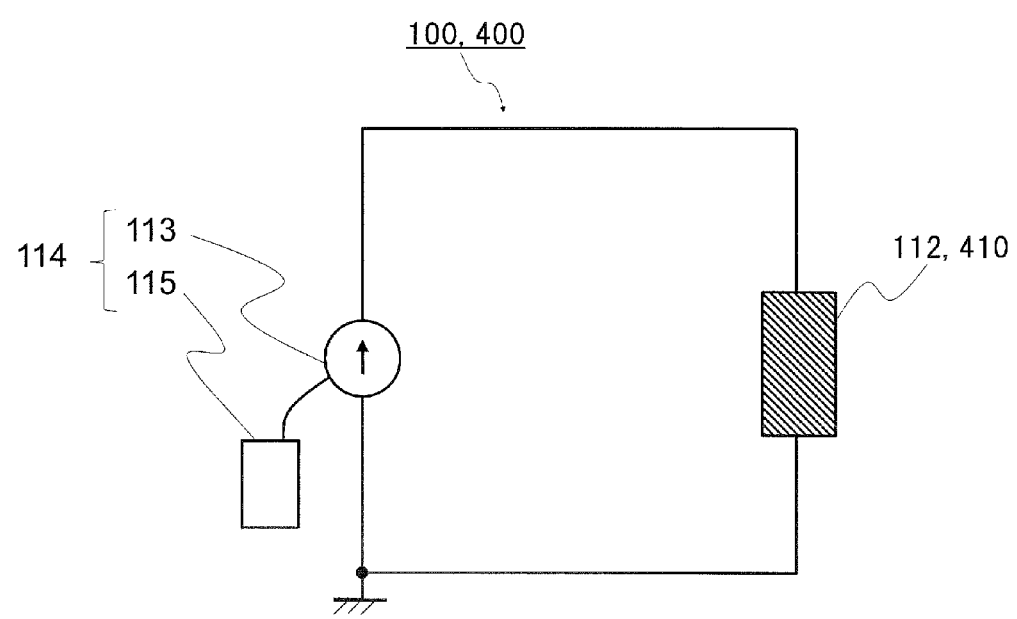
FIG. 2a is a circuit diagram of a magnetoresistive effect oscillator according to each of Embodiments 1 and 4 of the present invention.

FIG. 2a is a circuit diagram of a magnetoresistive effect oscillator. A magnetoresistive effect oscillator 100 includes a magnetoresistive effect element 112 and a current applying unit 114. The current applying unit 114 includes a current source 113 and a control unit 115. The current source 113 is connected to be able to supply a current to the magnetoresistive effect element 112. The control unit 115 controls the operation of the current source 113. FIG. 1 illustrates an example of configuration of the magnetoresistive effect element 112. The magnetoresistive effect element 112 includes a first magnetic layer 101, a second magnetic layer 102, and a spacer layer 103 arranged between them. The first magnetic layer 101 is electrically connected to a first electrode 110, and the second magnetic layer 102 is electrically connected to a second electrode 111, respectively. The current source 113 is connected between the first electrode 110 and the second electrode 111. A direction of magnetization in the first magnetic layer 101 is fixed here, and the fixed direction of magnetization in the first magnetic layer 101 is denoted by an arrow 104. A direction of magnetization in the second magnetic layer 102 is oriented in the direction of an effective magnetic field in a state before application of the current to the magnetoresistive effect element 112, and the direction of the effective magnetic field is denoted by an arrow 105. The effective magnetic field is the sum of an anisotropy magnetic field, an exchange magnetic field, an external magnetic field, and a demagnetizing field, which are generated in the second magnetic layer 102. While the direction of magnetization in the first magnetic layer 101 and the direction of the effective magnetic field in the second magnetic layer 102 are opposed to each other in FIG. 1, those directions are not limited to the illustrated orientations.

Each magnetic layer can be made of, e.g., Fe, Co, Ni, an alloy of Ni and Fe, an alloy of Fe and Co, or an alloy of Fe, Co and B.

The magnetoresistive effect element 112 can be formed of, though not being limited to particular one, e.g., a giant magnetoresistive effect (GMR) element, a tunnel magnetoresistive effect (TMR) element, or a Current-Confined-Path magnetoresistive effect (CCP-GMR) element in which a current-confined-path is present in an insulating layer serving as the spacer layer 103.

In the case of the GMR element, the spacer layer 103 can be made of a nonmagnetic conductive material, such as Cu, Ag, Au or Ru.

In the case of the TMR element, the spacer layer 103 can be made of a nonmagnetic insulating material, such as MgO or AlOx.

In the case of the CCP-GMR element, the insulating layer serving as the spacer layer 103 can be made of, e.g., AlOx or MgO, and the current-confined-path in the spacer layer 103 can be made of nonmagnetic conductive material, such as Cu, Ag, Au or Ru.

The magnetoresistive effect element 112 may include a first intermediate layer. For example, a nonmagnetic metal layer, a magnetic layer, or an insulating layer may be interposed between the first magnetic layer 101 and the spacer layer 103 or between the spacer layer 103 and the second magnetic layer 102.

Furthermore, to fix the direction of magnetization in the magnetic layer, the magnetoresistive effect element 112 may additionally include not only an antiferromagnetic layer in contact with the first magnetic layer 101 or the second magnetic layer 102, but also a second intermediate layer, a third magnetic layer, an antiferromagnetic layer, etc. in contact with the first magnetic layer 101 or the second magnetic layer 102. Alternatively, the direction of magnetization in the magnetic layer may be fixed by utilizing, e.g., magnetic anisotropy attributable to the crystal structure or the shape of the magnetic layer, for example.

The antiferromagnetic layer can be made of, e.g., FeO, CoO, NiO, $CuFeS_2$, IrMn, FeMn, PtMn, Cr, or Mn.

Moreover, a cap layer, a seed layer, or a buffer layer, for example, may be included between each electrode and each magnetic layer. Those layers can be made of, e.g., Ru, Ta, Cu, or Cr.

In the current applying unit 114, a voltage source, for example, may be connected between the electrodes instead of the current source 113.

In this specification, a current direction is defined as follows. A positive direction is defined as a direction toward the first magnetic layer 101 from the second magnetic layer 102, and a negative direction is defined as a direction toward the second magnetic layer 102 from the first magnetic layer 101.

Oscillation of the magnetoresistive effect element 112 according to Embodiment 1 is described below. Here, the term "oscillation" implies a phenomenon that electrical vibration is induced by a not-vibrational direct current.

The oscillation of the magnetoresistive effect element 112 is generated by dynamics of magnetization in the magnetic layer of the magnetoresistive effect element 112. The dynamics of magnetization can be expressed by the following LLG (Landau-Lifshitz-Gilbert) equation (1).

[Math. 1]

$$\frac{\partial v}{\partial t} = -|\gamma|(v \times H_{\mathit{eff}}) + \alpha\left(v \times \frac{\partial v}{\partial t}\right) + \frac{\mu_B P j}{e M_S} v \times (p \times v) \quad (1)$$

Here, v is a unit vector of magnetization in the second magnetic layer 102, γ is a gyromagnetic ratio, Heff is an effective magnetic field, p is a unit vector of magnetization in the first magnetic layer, α is a Gilbert damping constant, $\mu_B$ is a Bohr magneton, P is a spin polarization efficiency, j is a current density, e is an elementary charge, $M_S$ is a saturated magnetization, d is a thickness of the second magnetic layer 102, and t is a time. The first term in the right side is a precession term, the second term is a damping term, and the third term is a spin-transfer torque term.

When the second magnetic layer 102 can take substantially a single domain structure, motion of the magnetization in the second magnetic layer 102 can be calculated through approximation to a macro magnetization vector. In such a case, the dynamics of magnetization can be calculated by solving the equation (1).

The effective magnetic field is assumed to be the sum of an anisotropy magnetic field $H_k$ and a demagnetizing field $H_d$. $H_d$ is expressed by the following equation (2).

[Math. 2]

$$H_d = -N M_S v \quad (2)$$

Here, N is a demagnetization factor.

When a current I in the positive direction is applied in a direction perpendicular to a film surface of the magnetoresistive effect element 112, a conduction electron 106 flows in a direction reversed to the direction of the current I, i.e., in a direction toward the second magnetic layer 102 from the first magnetic layer 101 through the spacer layer 103. In the first magnetic layer 101 magnetized in the direction of the arrow 104, a spin of the conduction electron 106 is polarized in the direction of the arrow 104. An arrow 107 represents a spin direction of the conduction electron 106. The electron 106 having the polarized spin flows into the second magnetic layer 102 through the spacer layer 103, whereby transfer of angular momentum is performed with respect to the magnetization in the second magnetic layer 102. This develops an action (represented by the third term in the equation (1)) to change the direction of magnetization in the second magnetic layer 102 from a direction of the arrow 105 that represents the direction of the effective magnetic field. On the other hand, a damping action (represented by the second term in the equation (1)) is also developed to stabilize the direction of magnetization in the second magnetic layer 102 to be oriented in the direction of the arrow 105 that represents the direction of the effective magnetic field. Accordingly, those two actions are balanced, and the magnetization in the second magnetic layer 102 causes precession around the direction of the effective magnetic field. The precession is illustrated as a motion of an arrow 108, which represents the direction of magnetization in the second magnetic layer 102, around the arrow 105 that represents the direction of the effective magnetic field. A locus of the precession of the arrow 108 is denoted by a dotted line 109. Because the direction 108 of magnetization in the second magnetic layer 102 is changed relative to the direction 104 of magnetization in the first magnetic layer 101 at a high frequency, a resistance value of the magnetoresistive effect element 112 is also changed at the high frequency due to the magnetoresistive effect that resistance is changed depending on a relative angle between the direction 108 of magnetization in the second magnetic layer 102 and the direction 104 of magnetization in the first magnetic layer 101. With the change of the resistance value at the high frequency with respect to the current I, there occurs a voltage vibrating in a high-frequency range of about 100 MHz to several tens THz, for example. The direction 104 of magnetization in the first magnetic layer 101 may have an arbitrary direction, such as a direction horizontally extending in a surface of the magnetoresistive effect element or a direction perpendicular to the surface thereof. Furthermore, the direction of the effective magnetic field is not limited to the direction opposed to the direction 104 of magnetization in the first magnetic layer 101, and it may be the same as the direction 104 of magnetization in the first magnetic layer 101, or an arbitrary direction therebetween. However, a relative angle between the direction of the effective magnetic field and the direction 104 of magnetization in the first magnetic layer is preferably as large as possible.

Starting from a state where neither an external magnetic field nor a current is applied to the magnetoresistive effect element 112, by applying a direct current having a certain magnitude of current density in a state where an external magnetic field having a certain magnitude is applied as the occasion requires, the magnetization in the second magnetic layer 102 starts the precession, and the magnetoresistive effect element 112 causes oscillation. A minimum current density at that time is called a critical current density $j_O$ for oscillation, and it is known as being about $10^7$ A/cm$^2$. The critical current density for oscillation varies depending on the intensity and the direction of the external magnetic field.

The precession disappears when the applied current is gradually reduced starting from a condition that a current at not less than the critical current density for oscillation is applied to the magnetoresistive effect element 112 in the state where a constant magnetic field is applied as the occasion requires. A maximum current density at that time is called a critical current density $j_S$ for stationary. In other words, when a current is applied at not more than the critical current density for stationary, the magnetoresistive effect element 112 does not cause oscillation.

Moreover, when the current density applied to the magnetoresistive effect element 112 is very large, the spin-transfer torque effect gives rise to magnetization reversal that the magnetization in the second magnetic layer 102 is oriented substantially in the same direction as the magnetization in the first magnetic layer 101, whereupon the precession disappears. A minimum current density upon the occurrence of the magnetization reversal is called a critical current density $j_R$ for magnetization reversal.

Figure 23:
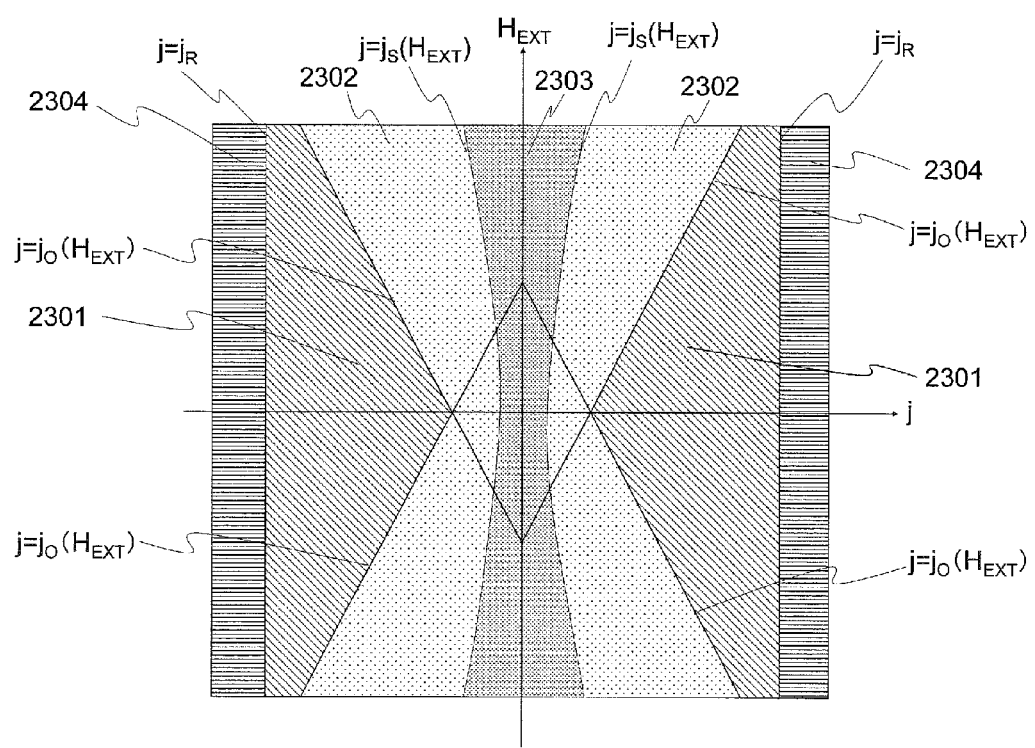
FIG. 23 is a graph representing a phase diagram of magnetization that causes precession.

FIG. 23 is one example of a phase diagram of the magnetization (i.e., magnetization that causes precession) in the second magnetic layer 102 of the magnetoresistive effect element 112, the phase diagram being prepared by simplifying that illustrated in PTL 1. In FIG. 23, the horizontal axis denotes a current density j applied to the magnetoresistive effect element 112, and the vertical axis denotes a magnetic field $H_{EXT}$ applied thereto.

A line denoted by $j=j_S(H_{EXT})$ represents dependency of $j_S$ on a magnetic field. There is a tendency that $j_S$ increases as the intensity of the applied magnetic field is increased.

A line denoted by $j=j_O(H_{EXT})$ represents dependency of $j_O$ on a magnetic field. There is a tendency that $j_O$ increases substantially linearly as the intensity of the applied magnetic field is increased.

A line denoted by $j=j_R$ represents that $j_R$ is constant regardless of change of the external magnetic field.

A state of the magnetization in the magnetic layer of the magnetoresistive effect element 112 depending on the current density applied to the magnetoresistive effect element 112 is described below, by way of example, on condition that a certain constant magnetic field $H_{EXT1}$ is applied.

When the current density j applied to the magnetoresistive effect element 112 is in the range of $j_R > j \ge j_O$, the operating point of the magnetoresistive effect element 112 is positioned in a region 2301. In this case, the magnetization in the second magnetic layer 102 causes the precession and only an oscillating condition is stabilized.

When j is in the range of $j_S \ge j$, the operating point of the magnetoresistive effect element 112 is positioned in a region 2303. In this case, the precession of the magnetization in the second magnetic layer 102 disappears, and only a static condition (i.e., a condition where the magnetoresistive effect element does not cause oscillation) is stabilized.

When j is in the range of $j \ge j_R$, the operating point of the magnetoresistive effect element 112 is positioned in a region 2304. In this case, the magnetization in the second magnetic layer 102 of the magnetoresistive effect element 112 is reversed, and the magnetoresistive effect element 112 is stabilized only in the static condition.

When j is in the range of $j_O > j > j_S$, the operating point of the magnetoresistive effect element 112 is positioned in a region 2302. In this case, a stable condition of the magnetization in the second magnetic layer 102 varies depending on the preceding history. More specifically, when the operating point has been transited from the region 2301 to the region 2302, the precession is generated, thus resulting in the oscillating condition. On the other hand, when the operating point has been transited from the region 2303 to the region 2302, the static condition is resulted. Thus, the region 2302 is called a region of bistability.

The following relational formula holds in an Auto-Oscillation model that is obtained by modeling a stable oscillating condition of a general nonlinear oscillation element.

[Math. 3]

$$\frac{1}{p_{out}} \propto 1 - \frac{j}{j_O} \quad (3)$$

Here, $p_{out}$ is an oscillation output.

A method of experimentally determining the critical current density for oscillation is described below. First, the oscillation output $p_{out}$ in a steady state is measured while the current density applied to the magnetoresistive effect element 112 is changed. The measurement can be performed by utilizing, e.g., a spectrum analyzer or an oscilloscope. Then, the critical current density $j_O$ for oscillation can be obtained by plotting the measurement result on a graph in which the vertical axis denotes $1/p_{out}$ and the horizontal axis denotes j, and by determining j, at which $1/p_{out}=0$ is satisfied, through extrapolation, for example. In a current range where the current density of $j_O$ or more is applied to the magnetoresistive effect element 112, only the oscillating condition is stabilized.

A method of experimentally determining, with respect to the operating point of the magnetoresistive effect element 112, the region of bistability and the region where only the static condition is stabilized will be described below. The operating point of the magnetoresistive effect element 112 is positioned in the region of bistability when, after applying a current at not less than the critical current density for oscillation to the magnetoresistive effect element 112 and then gradually reducing the current from a steady state little by little, the oscillating condition is obtained in a steady state. On the other hand, when the static condition is obtained instead, the operating point of the magnetoresistive effect element 112 is positioned in the region where only the static condition is stabilized. The region of bistability and the region where only the static condition is stabilized can be each experimentally determined by carrying out the above-described trial while the magnetic field is changed.

Embodiment 1 represents the case where the current is applied to the magnetoresistive effect element 112 in order to sustain the oscillation of the magnetoresistive effect element 112.

The operation of the current source 113 controlled by the control unit 115 in Embodiment 1 is described below. In a first step, the current source 113 applies or does not apply, to the magnetoresistive effect element 112, a current having a current density not more than the critical current density $j_S$ for stationary such that the operating point of the magnetoresistive effect element 112 is positioned in the region where only the static condition is stabilized. At that time, the magnetization in the second magnetic layer 102 is oriented in the direction 105 of the effective magnetic field. Then, in a second step, the current source 113 applies, to the magnetoresistive effect element 112, a current flowing in the positive direction and having a first current density that is more than the critical current density $j_O$ for oscillation. Then, in a third step, the current source 113 applies, to the magnetoresistive effect element 112, a current flowing in the positive direction and having a second current density, which is less than the first current density and not less than the critical current density for oscillation, such that the magnetoresistive effect element 112 oscillates at a predetermined frequency.

Figure 2B:
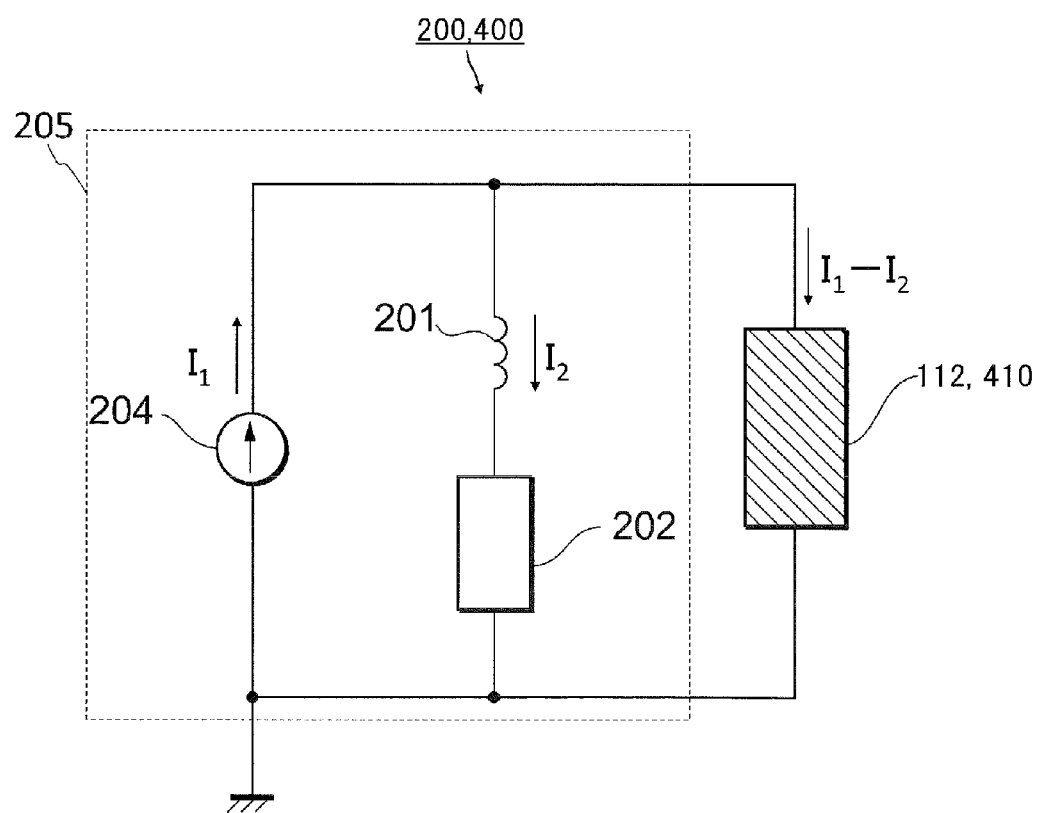
FIG. 2b is a circuit diagram of a magnetoresistive effect oscillator according to each of Embodiments 1, 4 and 7 of the present invention.

An example of utilizing a peripheral circuit as a means for implementing the above-described current steps, instead of the method of controlling the current source 113, is described below. FIG. 2b is a circuit diagram of a magnetoresistive effect oscillator 200. The magnetoresistive effect oscillator 200 includes a magnetoresistive effect element 112 and a current applying unit 205. The current applying unit 205 includes an inductor 201, a resistance 202, and a current source 204. The magnetoresistive effect element 112 and the inductor 201 are connected in parallel, and the inductor 201 and the resistance 202 are connected in series. Those components arranged in such a way are connected to the current source 204.

When the current source 204 generates a current $I_1$ having the first current density, an electromotive force is generated in the inductor 201 so as to cancel change of magnetic flux. Accordingly, the current substantially does not flow through the resistance 202, and almost all of the current $I_1$ flows through the magnetoresistive effect element 112. Thereafter, when time-varying fluctuations in the current $I_1$ are settled, the electromotive force disappears and a current $I_2$ flows through the resistance 202 whereas a constant current $I_1-I_2$ flows through the magnetoresistive effect element 112. Here, respective values of the inductor 201 and the resistance 202 are adjusted such that $I_1-I_2$ becomes a current having the second current density. Thus, the magnetoresistive effect oscillator 200 can generate the drive current in Embodiment 1.

A means for experimentally determining the above-described current applying steps is now described. By holding probes in contact with the electrodes 110 and 111 and measuring a voltage between the electrodes in time domain with an oscilloscope, for example, it is possible to estimate time-dependent change of the current, which is applied to the magnetoresistive effect element, and to experimentally determine, e.g., the magnitude and time of a current pulse.

A mechanism through which a rise of oscillation of the magnetoresistive effect element 112 is sped up by the above-described operation method is not clarified, but the mechanism is presumably as follows.

Figure 3:
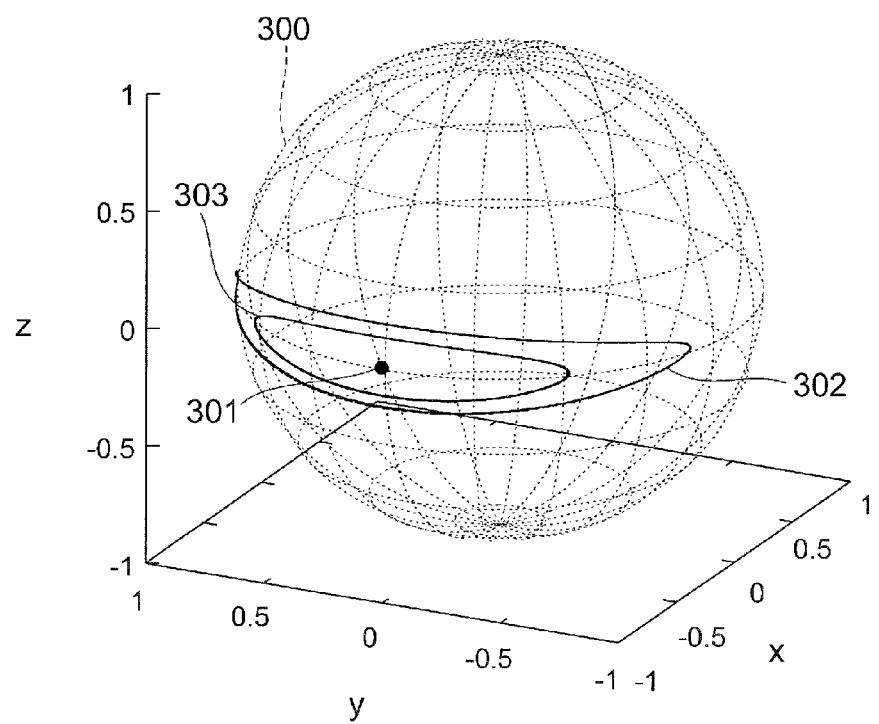
FIG. 3 is a three-dimensional graph representing an orbit of precession of magnetization in a second magnetic layer of the magnetoresistive effect element according to Embodiment 1 of the present invention.

FIG. 3 is a three-dimensional graph representing a locus of a typical magnetization vector in the second magnetic layer 102. Here, axes of an xyz-orthogonal coordinate system are defined such that the direction of the current applied to the magnetoresistive effect element 112 is a negative direction of a z-axis, and that the direction of magnetization in the first magnetic layer 101 of the magnetoresistive effect element 112 is given by (1, 0, 0). A spherical surface 300 with the origin O (0, 0, 0) set at a center represents a surface over which the direction of the magnetization is movable. A point 301 represents the direction of the effective magnetic field. Before the current is applied to the magnetoresistive effect element 112, the magnetization vector in the second magnetic layer 102 is oriented toward the point 301 from the origin O and is held stationary. A locus 302 represents an orbit of the precession of the magnetization in the second magnetic layer 102 when a current flowing in the positive direction and having the first current density, which is not less than the critical current density for oscillation, is continuously applied to the magnetoresistive effect element 112 and a stable oscillating condition is obtained. A locus 303 represents an orbit of the precession of the magnetization in the second magnetic layer 102 when a current having the second current density is continuously applied to the magnetoresistive effect element 112 and a stable oscillating condition is obtained.

Referring to FIG. 3, the following description is first made regarding the case where the current having the second current density is applied to the magnetoresistive effect element immediately after the first step in Embodiment 1 with omission of the second step.

In that case, starting from the state where the magnetization in the first magnetic layer 101 is fixed in the direction 104 and the direction of magnetization in the second magnetic layer 102 is oriented in the direction 105 of the effective magnetic field, the current flowing in the positive direction and having the second current density is applied to the magnetoresistive effect element 112 such that the magnetoresistive effect element 112 oscillates at a predetermined frequency. As a result, the direction of magnetization in the second magnetic layer 102 is changed from the point 301 representing the direction of the effective magnetic field while rotating due to the action of the spin-transfer torque term, i.e., the third term in the right side of the equation (1). Thus, the magnetization in the second magnetic layer 102 starts the precession on the locus 303 in a steady state where the action attributable to the spin-transfer torque term and the action attributable to the damping term, i.e., the second term in the right side of the equation (1), are balanced.

On the other hand, in the operation according to Embodiment 1, starting from the state where the magnetization in the first magnetic layer 101 is fixed in the direction 104 and the magnetization in the second magnetic layer 102 is oriented in the direction 105 of the effective magnetic field, the current flowing in the positive direction and having the first current density, which is larger than the second current density, is applied to the magnetoresistive effect element 112 in the second step. As a result, the spin-transfer torque term is increased to a larger extent and the direction of magnetization in the second magnetic layer 102 is more rapidly changed toward the orbit denoted by the locus 302 than in the case where the second step is omitted. Then, the magnetization in the second magnetic layer 102 continues the precession on the locus 302 in a first oscillating condition where the action attributable to the spin-transfer torque term and the action attributable to the damping term, i.e., the second term in the right side of the equation (1), are balanced.

Next, a mechanism of transition from the first stable oscillating condition in the second step to a second stable oscillating condition in the third step in Embodiment 1 is described.

In the operation according to Embodiment 1, a current flowing in the positive direction and having the second current density, which is less than the first current density, is applied to the magnetoresistive effect element 112 as the third step. As a result, the spin-transfer torque is weakened, and the direction of magnetization in the second magnetic layer 102 is changed toward the point 301 representing the direction of the effective magnetic field. During a process of such a motion of the magnetization vector, the magnetization vector in the second magnetic layer 102 comes into the locus 303, i.e., a stable orbit when the current has the second current density, and the magnetoresistive effect element 112 is transited to the second stable oscillating condition (i.e., the condition where the action attributable to the spin-transfer torque term and the action attributable to the damping term are balanced).

A first transition time of the transition from the first stable oscillating condition where the precession is continued on the locus 302 to the second stable oscillating condition where the precession is continued on the locus 303 depends on the damping term, i.e., the second term in the right side of the equation (1), and further depends on the Gilbert damping constant α. In the case of a general magnetic substance, it is known that α is about 0.01 or more. Therefore, the damping action is large, and the first transition time is short.

When the second step is omitted, the first transition time does not exist. Comparing a rise time of the oscillation in total, however, the rise time in Embodiment 1 is shorter than that in the case where the second step is omitted, because the second step contributes to speeding up the rise to a large extent.

In the third step, the current having the second current density is continuously applied to the magnetoresistive effect element 112, and the oscillation is sustained at the frequency corresponding to the second current density.

PTL 1 discloses the method of operating the magnetoresistive effect element through a step of making the operating point of the magnetoresistive effect element positioned in the region of bistability. In this case, when the external magnetic field or the applied current temporarily varies in the oscillating condition by, e.g., external noise, there is a risk that the magnetoresistive effect element may be transited to the static condition where the precession does not occur, and that the oscillation may remain disappeared after the transition. Thus, the operation method disclosed in PTL 1 has a problem in realizing both a high-speed rise of the oscillation and the sustained oscillation. In contrast, according to Embodiment 1, the current having second current density, which is not less than the critical current density for oscillation, is applied to the magnetoresistive effect element. Therefore, even if the above-mentioned fluctuations in the magnetic field or the current are temporarily generated by, e.g., external noise and the magnetoresistive effect element is temporarily transited to the static condition, the oscillation restores and continues upon return to the original magnetic field and the original current. Thus, this embodiment is preferable from the viewpoint of ensuring that the magnetoresistive effect element sustains the oscillation more stably.

The mechanism has been described above in connection with an oscillation mode in which the magnetization in the second magnetic layer 102 causes the precession substantially in a plane of the magnetoresistive effect element 112, but the oscillation mode is not limited to the above-described one. The above-described mechanism is similarly applied, for example, to the case where the magnetization in the second magnetic layer 102 causes the precession in a direction substantially perpendicular to the magnetoresistive effect element 112.

The larger the first current density, the faster is the rise of the oscillation. When the first current density is 1.5 times or more the second current density, an effect of increasing the effect of shortening the rise time of the oscillation, which is obtained with the speed-up of the rise resulting from the second step, in excess of the influence of an increase in the rise time of the oscillation due to the first transition time is more significant. Accordingly, the first current density is desirably 1.5 times or more the second current density.

Furthermore, when the magnetoresistive effect element 112 is stabilized in a magnetization reversal state where the magnetization in the second magnetic layer 102 of the magnetoresistive effect element 112 is oriented substantially in the same direction as the magnetization in the first magnetic layer, the first current density applied at not less than the critical current density for oscillation to the magnetoresistive effect element 112 in the second step is desirably smaller than the critical current density $j_R$ for magnetization reversal. When a time during which the current having the first current density is applied to the magnetoresistive effect element 112 is shorter than a time during which the magnetization reversal occurs, the first current density may be not less than the critical current density $j_R$ for magnetization reversal.

(Embodiment 2)

In this embodiment, a magnetoresistive effect oscillator is assumed to be the same as that in Embodiment 1 except for the operation of the current source 113. A current is applied to the magnetoresistive effect element 112 by controlling the current source 113 with the control unit 115 and operating the current source 113 as follows. As a first step, the current source 113 applies, to the magnetoresistive effect element 112, a current flowing in the positive direction and having a third current density, which is not less than the critical current density for oscillation, such that the operating point of the magnetoresistive effect element 112 is positioned in the region where only the oscillating condition is stabilized. Then, in a second step, the current source 113 applies, to the magnetoresistive effect element 112, a current flowing in the positive direction and having a first current density that is not less than the critical current density for oscillation. Then, in a third step, the current source 113 applies, to the magnetoresistive effect element 112, a current flowing in the positive direction and having a second current density that is less than the first current density and not less than the critical current density for oscillation. The second current density is larger than the third current density. A mechanism of causing a rise of oscillation to be sped up in this case is presumably as follows, as in Embodiment 1.

According to this embodiment, since the current having the first current density, which is larger than the second current density, is applied to the magnetoresistive effect element 112 as the second step, the spin-transfer torque term is increased to a larger extent and the direction of magnetization in the second magnetic layer 102 is more rapidly changed than in the case where the second step is omitted. Thereafter, when the current having the second current density is applied to the magnetoresistive effect element 112 in the third step, comparatively strong damping torque is exerted because the second current density is smaller than the first current density. Hence a transition time until the oscillation is stabilized is shortened. As a result, the rise of the oscillation can be sped up in this embodiment in comparison with the case where the second step is omitted.

(Embodiment 3)

In this embodiment, a magnetoresistive effect oscillator is assumed to be the same as that in Embodiment 1 except for the operation of the current source 113. A current is applied to the magnetoresistive effect element 112 by controlling the current source 113 with the control unit 115 and operating the current source 113 as follows. As a first step, the current source 113 applies, to the magnetoresistive effect element 112, a current flowing in the positive direction and having a third current density, which is less than the critical current density for oscillation, such that the operating point of the magnetoresistive effect element 112 is positioned in the region of bistability. Then, in a second step, the current source 113 applies, to the magnetoresistive effect element 112, a current flowing in the positive direction and having a first current density that is more than the critical current density for oscillation. Then, in a third step, the current source 113 applies, to the magnetoresistive effect element 112, a current flowing in the positive direction and having a second current density that is less than the first current density and not less than the critical current density for oscillation. A mechanism of causing a rise of oscillation to be sped up in this case is similar to that in Embodiments 1 and 2.

When the application of the current in the second step according to this embodiment is performed starting from the state where the oscillation disappears after applying the current in the positive direction to the magnetoresistive effect element 112 in the first step such that the magnetoresistive effect element 112 is positioned in the region of stability, the magnetization in the second magnetic layer 102 is moved and the rise of the oscillation is sped up as in Embodiment 1.

On the other hand, when the application of the current in the second step is performed starting from the state where the oscillation occurs after applying the current in the positive direction to the magnetoresistive effect element 112 in the first step such that the magnetoresistive effect element 112 is positioned in the region of stability, the magnetization in the second magnetic layer 102 is moved and the rise of the oscillation is sped up as in Embodiment 2.

Thus, the rise of the oscillation of the magnetoresistive effect element 112 can be sped up by employing this embodiment.

(Embodiment 4)

Figure 4:
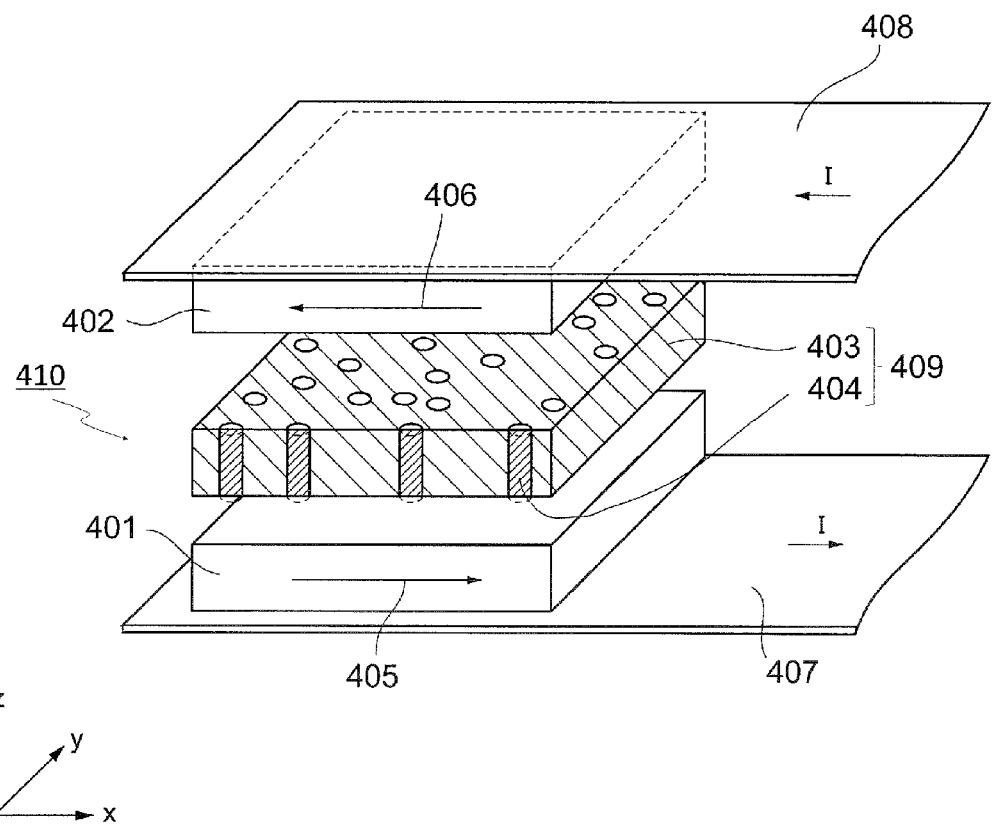
FIG. 4 is a schematic view of a magnetoresistive effect oscillator according to Embodiment 4 of the present invention.

In a magnetoresistive effect oscillator 400 according to Embodiment 4, a magnetoresistive effect element 410 is used instead of the magnetoresistive effect element 112 in the magnetoresistive effect oscillator 100 according to Embodiment 1. The other configuration is the same as that of the magnetoresistive effect oscillator 100 according to Embodiment 1. FIG. 4 is a schematic view of the magnetoresistive effect element 410. The magnetoresistive effect element 410 includes a first magnetic layer 401, a second magnetic layer 402, and a spacer layer 409 arranged between them. A first electrode 407 is disposed in contact with the first magnetic layer 401, and a second electrode 408 is disposed in contact with the second magnetic layer 402, respectively. A current source 113 is connected between the electrode 407 and the electrode 408. A voltage source may be connected instead of the current source 113. The spacer layer 409 includes an insulating portion 403 and ferromagnetic nano-contact regions 404. The first magnetic layer 401, the second magnetic layer 402, and the ferromagnetic nano-contact regions 404 are each formed using a ferromagnetic substance and desirably made of, e.g., an alloy of Fe and Co, an alloy of Fe, Co and Al, or an alloy of Fe, Co, Al and Si. The insulating portion 403 is desirably made of a material having good electrical insulation, e.g., AlOx or MgO. Magnetizations in the first magnetic layer 401 and the second magnetic layer 402 are oriented in directions denoted by arrows 405 and 406, respectively, and magnetic domain walls are formed in the ferromagnetic nano-contact regions 404. An element having the above-mentioned structure is called an NCMR (nano-contact magnetoresistive effect) element. While the spacer layer 409 is actually in contact with the first magnetic layer 401 and the second magnetic layer 402 such that the first magnetic layer 401 and the second magnetic layer 402 are electrically connected to each other through the ferromagnetic nano-contact regions 404, the spacer layer 409 is illustrated in FIG. 4 in spaced relation from the first magnetic layer 401 and the second magnetic layer 402 for easier understanding of the structure of the spacer layer 409.

The direction of the arrow 406 is not limited to a direction opposed to that of the arrow 405, and it may be the same direction as that of the arrow 405 or an arbitrary direction between both the arrows.

An xy-plane is assumed to be a plane that is parallel to a film surface of the magnetoresistive effect element 410. A direction perpendicular to the film surface of the magnetoresistive effect element 410 is defined as the direction of a z-axis.

Figure 5:
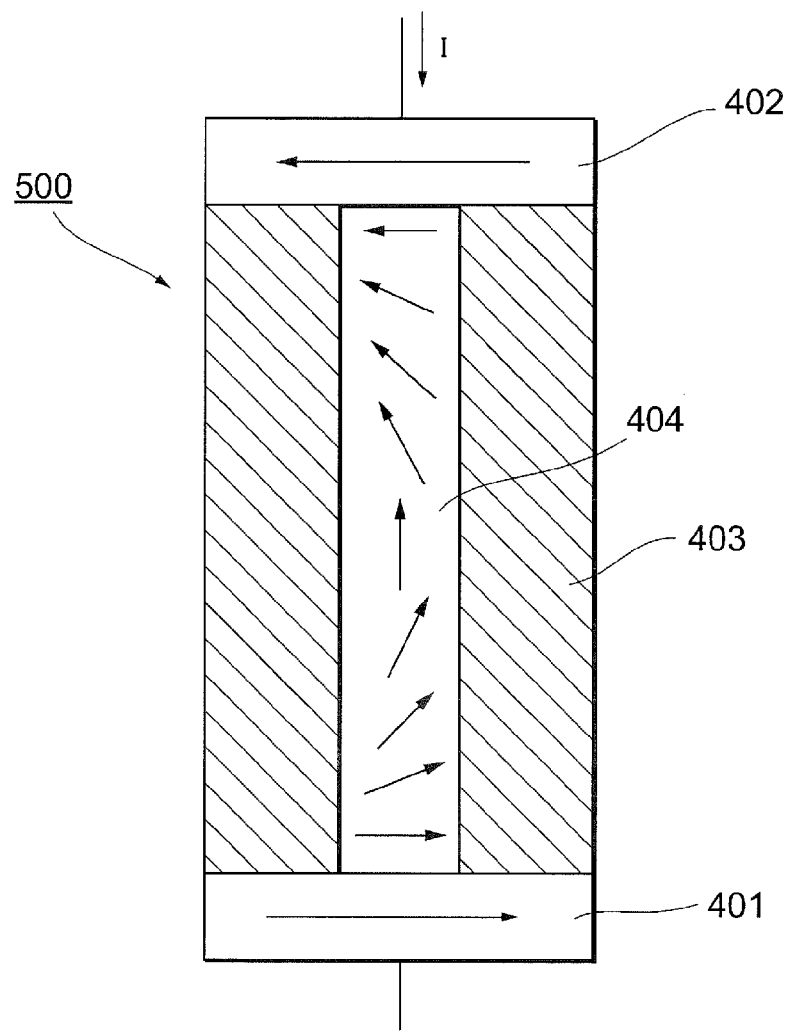
FIG. 5 illustrates a calculation model for the magnetoresistive effect oscillator according to Embodiment 4 of the present invention.

For the purpose of calculating an oscillation phenomenon of the magnetoresistive effect element 410, dynamics of a magnetic domain wall formed in one ferromagnetic nano-contact of the magnetoresistive effect element 410 are calculated. FIG. 5 illustrates a calculation model of the ferromagnetic nano-contact. In a modeling process, respective directions of magnetizations in the first magnetic layer 401 and the second magnetic layer 402 are assumed to be fixed. For example, an external magnetic field, exchange coupling with an antiferromagnetic substance, or a magnetic anisotropy can be utilized as a means for fixing the magnetic layers. The magnetic domain wall formed between the first magnetic layer 401 and the second magnetic layer 402 is assumed to be in the form in which magnetizations exchange-coupled with each other are one-dimensionally arranged in the z-axis direction from the first magnetic layer 401 toward the second magnetic layer 402.

In the calculation, the following equation slightly modified from the equation (1) is used.

[Math. 4]

$$\frac{\partial v}{\partial t} = -|\gamma|(v \times H_{\mathit{eff}}) + \alpha\left(v \times \frac{\partial v}{\partial t}\right) + \frac{\mu_B P j}{e M_S} v \times \left(\frac{\partial v}{\partial z} \times v\right) \quad (4)$$

The effective magnetic field is assumed to be only an exchange magnetic field of which intensity is determined depending on an exchange coupling constant.

Figure 6A:
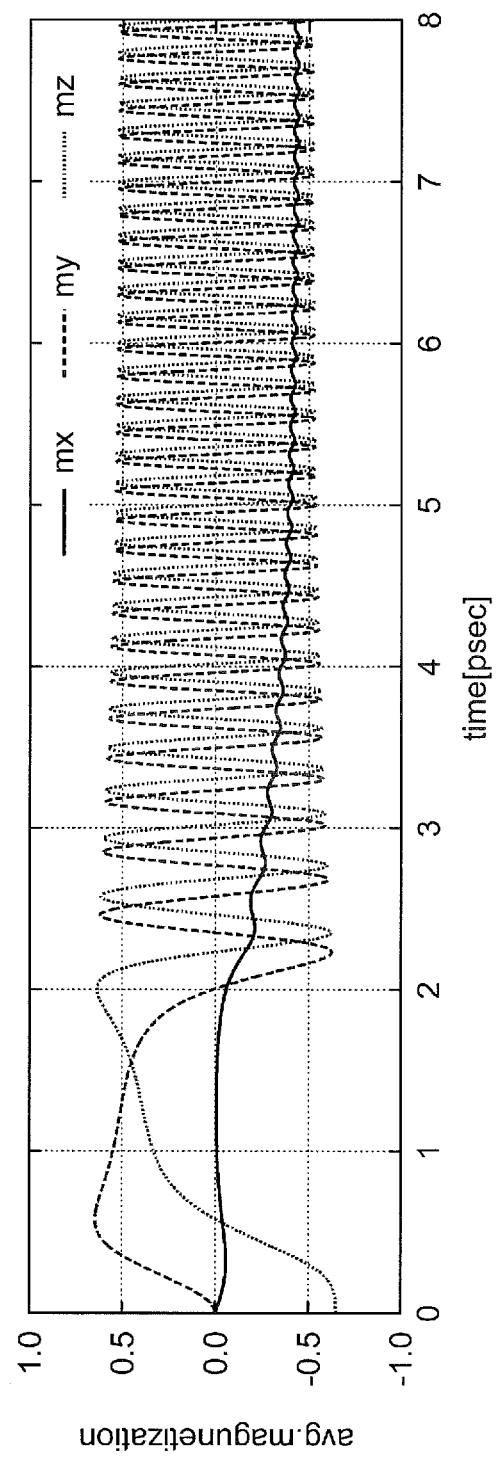
FIG. 6a is a graph representing the calculation result of a critical current density for oscillation in EXAMPLE 2 of the present invention.

When a current I is applied to the magnetoresistive effect oscillator 410 through the electrodes to flow in the direction perpendicular to the individual layers, the spin-transfer torque acts on the magnetic domain wall, thus causing the magnetoresistive effect element 410 to oscillate. For the purpose of explanation, the following review is made on an assumption that the magnetization in the first magnetic layer 401 is fixed substantially in a direction of (1, 0, 0), and that the magnetization in the second magnetic layer 402 is fixed substantially in a direction of (−1, 0, 0). In the ferromagnetic nano-contact, the magnetic domain wall is formed by the magnetization of which direction is gradually changed from the direction of (1, 0, 0) toward the direction of (−1, 0, 0). FIG. 6a represents the calculation results of time-dependent changes of average values of individual components of a magnetization vector in the ferromagnetic nano-contact when a current having the critical current density for oscillation is applied to the magnetoresistive effect element 410. When an average value $m_y$ of a y-component of the magnetization vector is zero, the magnetic domain wall in the ferromagnetic nano-contact is a Neel wall, and when an average value $m_z$ of a z-component is zero, the magnetic domain wall is a Bloch wall. After 3 picoseconds (psec), the magnetization vector vibrates while $m_y$ and $m_z$ alternately take zero. In other words, the magnetization in the ferromagnetic nano-contact periodically causes precession. Thus, there occurs a phenomenon that the Neel wall and the Bloch wall alternately transit from one to the other. Because those two magnetic domain walls have different resistance values, resistance vibrates and oscillation occurs.

In this embodiment, as in the magnetoresistive effect oscillator 100 according to Embodiment 1, a drive current can be generated by a circuit illustrated as the circuit diagram of FIG. 2a, for example. Moreover, in this embodiment, as in the magnetoresistive effect oscillator 200 according to Embodiment 1, the drive current can be generated by a circuit illustrated as the circuit diagram of FIG. 2b, for example.

Also in this embodiment, the rise of the oscillation of the magnetoresistive effect element 410 can be sped up through a similar mechanism to that in Embodiment 1.

The mechanism of causing the rise of the oscillation of the magnetoresistive effect element 410 to be sped up in Embodiment 4 is described below. When a current having a first current density, which is not less than the critical current density for oscillation, is applied to the magnetoresistive effect element 410, the current flows through the ferromagnetic nano-contact, whereupon the magnetization in the ferromagnetic nano-contact causes precession.

More specifically, in the second step, the current source 113 applies a current having the first current density not less than the critical current density for oscillation to the magnetoresistive effect element 410. At that time, because the current flows at a density larger than that in the case where the second step is omitted, the action of a spin-transfer torque term, i.e., a third term in a right side of the equation (4), is increased and the direction of magnetization in the ferromagnetic nano-contact is changed in rapid response. Then, the magnetization in the ferromagnetic nano-contact starts first precession under condition where the action attributable to the spin-transfer torque term and the action attributable to a damping term, i.e., a second term in the right side of the equation (4), are balanced.

Thereafter, in the third step, the current source 113 applies a current having a second current density, which is smaller than the first current density, to the magnetoresistive effect element 410. As a result, the action of the spin-transfer torque exerted on the magnetization in the ferromagnetic nano-contact is reduced, and the magnetization therein causes second precession under condition where the action of the spin-transfer torque and the action of the damping term are balanced. A transition time from the first precession to the second precession depends on the damping term, and the transition time is short as in Embodiment 1. When the second step is omitted, the above-described transition time does not exist. Comparing a rise time of the oscillation in total, however, the rise time in Embodiment 4 is shorter than that in the case where the second step is omitted, because the second step contributes to speeding up the rise of the oscillation to a large extent.

The larger the first current density, the faster is the rise of the oscillation. When the first current density is 1.5 times or more the second current density, an effect of increasing the effect of shortening the rise time of the oscillation, which is obtained with the speed-up of the rise resulting from the second step, in excess of the influence of an increase in the rise time of the oscillation due to the first transition time is more significant. Accordingly, the first current density is desirably 1.5 times or more the second current density.

While the directions of magnetizations in the first magnetic layer 401 and the second magnetic layer 402 are assumed to be fixed in Embodiment 4, the rise of the oscillation can be sped up, for example, even when the second magnetic layer is a magnetization free layer in which the direction of magnetization is not fixed.

(Embodiment 5)

In this embodiment, a magnetoresistive effect oscillator 100 is assumed to be the same as that in Embodiment 1 except for the operation of the current source 113, and a magnetoresistive effect oscillator 200 is assumed to be the same as that in Embodiment 1 except for the operation of the current source 204.

Embodiment 5 represents the case of making oscillation disappeared from a state where the magnetoresistive effect element 112 is oscillating.

The operation of the current source 113 controlled by the control unit 115 in Embodiment 5 is described below. Starting from the state where the current source 113 applies the current flowing in the positive direction and having a first current density to the magnetoresistive effect element 112 and the magnetoresistive effect element 112 is oscillating, the current source 113 applies a current having a second current density and flowing in a direction reversed to that of the current having the first current density, i.e., in the negative direction, to the magnetoresistive effect element 112, thus making the oscillation of the magnetoresistive effect element 112 disappeared.

Figure 2C:
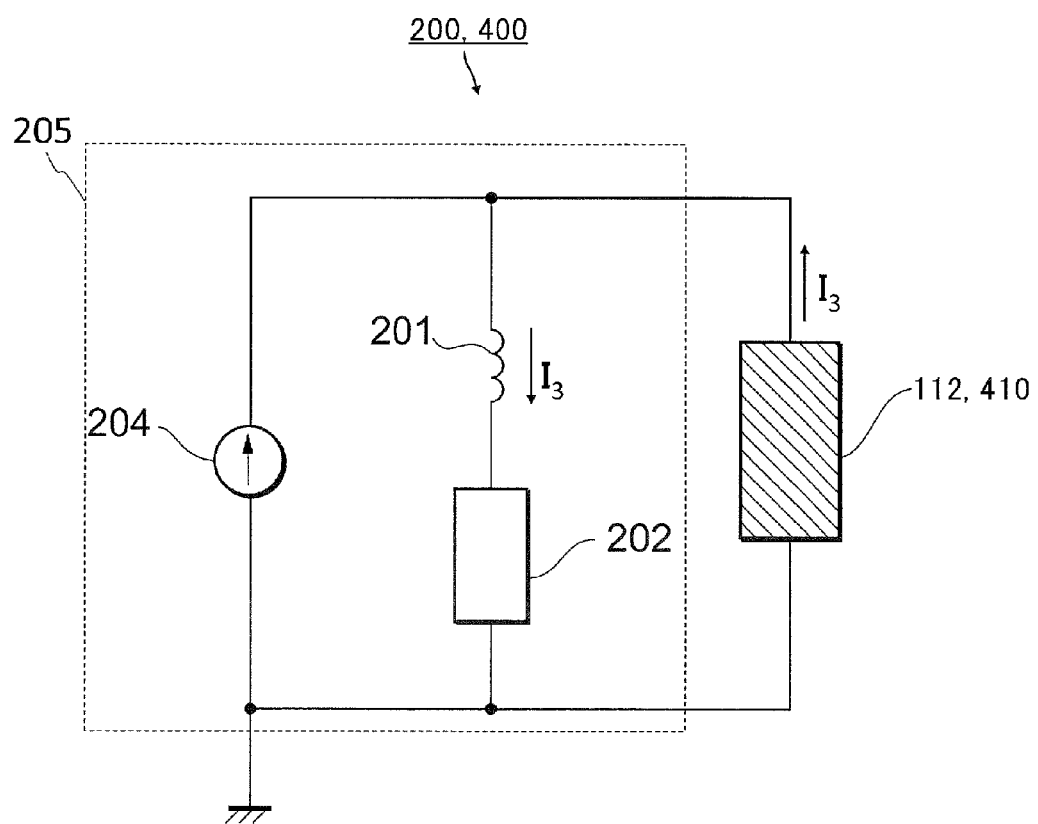
FIG. 2c is a circuit diagram of a magnetoresistive effect oscillator according to each of Embodiments 5, 6 and 7 of the present invention.

An example of the current applying unit using a circuit to implement the above-described current steps is described below. FIG. 2c is a circuit diagram of the magnetoresistive effect oscillator 200. The magnetoresistive effect oscillator 200 includes a magnetoresistive effect element 112 and a current applying unit 205. The current applying unit 205 includes an inductor 201, a resistance 202, and a current source 204. The magnetoresistive effect element 203 and the inductor 201 are connected in parallel, and the inductor 201 and the resistance 202 are connected in series.

When the current applied from the current source 204 is stopped in the state where the current having the first current density is applied to the magnetoresistive effect element 112, an electromotive force is generated in the inductor 201 so as to cancel change of magnetic flux. Accordingly, a current $I_3$ flows through the inductor 201 in the same direction as that of the current, which has been applied so far at the first current density, while the current $I_3$ flows through the magnetoresistive effect element 112 in a direction reversed to that of the current, which has been applied so far at the first current density. Respective values of the inductor 201 and the resistance 202 are adjusted such that the current $I_3$ becomes a current having the second current density. Thereafter, when change of the current is ceased, the electromotive force disappears and no current flows through the magnetoresistive effect element 112. Thus, the magnetoresistive effect oscillator 200 can generate a drive current to be applied for a fall of the oscillation.

A mechanism of causing the oscillation of the magnetoresistive effect element 112 to fall rapidly in Embodiment 5 is presumably as follows.

In the state where the magnetoresistive effect element 112 is oscillating, the second term and the third term of the equation (1) are substantially balanced. When the current having the second current density and flowing in the direction reversed to that of the current having the first current density is applied to the magnetoresistive effect element 112 at that time, a sign of the spin-transfer torque term, expressed by the third term, is reversed to develop an action to intensify the damping term expressed by the second term. As a result, the magnetization in the second magnetic layer 102 of the magnetoresistive effect element 112 is rapidly oriented toward the direction of the effective magnetic field, whereupon the oscillation disappears. By stopping the current applied to the magnetoresistive effect element 112 after the oscillation of the magnetoresistive effect element 112 has disappeared, the oscillation disappeared state of the magnetoresistive effect element 112 is sustained. When the second current density is smaller than the critical current density for oscillation, the oscillation disappeared state of the magnetoresistive effect element 112 is sustained even when the current having the second current density is continuously applied to the magnetoresistive effect element 112. When the second current density is not smaller than the critical current density for oscillation, the oscillation disappeared state of the magnetoresistive effect element 112 is sustained by applying a current having a third current density, which is smaller than the critical current density for oscillation, instead of the current having the second current density after the oscillation of the magnetoresistive effect element 112 has disappeared. Stated in another way, the oscillation disappeared state of the magnetoresistive effect element 112 is sustained by applying the current having the current density, which is smaller than the critical current density for oscillation, to the magnetoresistive effect element 112, or by stopping the application of the current after the oscillation of the magnetoresistive effect element 112 has disappeared. A direction of the current having the current density, which is smaller than the critical current density for oscillation and which is applied to the magnetoresistive effect element 112 after the oscillation of the magnetoresistive effect element 112 has disappeared, may be positive or negative. Thus, the fall of the oscillation of the magnetoresistive effect element 112 can be sped up by employing the magnetoresistive effect oscillators 100 and 200 according to Embodiment 5.

(Embodiment 6)

Embodiment 6 is described below. In a magnetoresistive effect oscillator 400 according to Embodiment 6, the magnetoresistive effect element 410 described in Embodiment 4 is used instead of the magnetoresistive effect element 112 in the magnetoresistive effect oscillator 100 according to Embodiment 5. The other configuration is the same as that of the magnetoresistive effect oscillator 100 according to Embodiment 5.

One conceivable example of a typical means for stopping the oscillation of the magnetoresistive effect element 410 is a method of stopping the current that has been applied to the magnetoresistive effect element 410 under the oscillation. In such a case, because the spin-transfer torque does no longer exert after stopping the application of the current to the magnetoresistive effect element 410, local magnetization in each ferromagnetic nano-contact is going to transit to the stable static condition due to the damping term. However, each local magnetization is subjected to a force generated by exchange coupling that tends to orient the local magnetization in the same direction as that of the adjacent local magnetization, and the force acts to inhibit momentary transition to the static condition.

In Embodiment 6, to momentarily stop the oscillation of the magnetoresistive effect element 410, the current applied to the magnetoresistive effect element 410 is changed as follows. In the oscillating condition with application of the current flowing in the positive direction and having the first current density to the magnetoresistive effect element 410, a current having the second current density and flowing in the negative direction, which is reversed to the direction of the current having the first current density, is applied to the magnetoresistive effect element 410, thus making the oscillation of the magnetoresistive effect element 410 disappeared. Thereafter, the oscillation disappeared state of the magnetoresistive effect element 410 is sustained by applying a current having a current density, which is smaller than the critical current density $j_O$ for oscillation, to the magnetoresistive effect element 112, or by stopping the application of the current thereto.

The current steps in Embodiment 6 can be implemented by utilizing a peripheral circuit, which is similar to that used in Embodiment 5, as the current applying unit to implement the above-described current steps.

The magnetization in the ferromagnetic nano-contact of the magnetoresistive effect element 410 in Embodiment 6 operates substantially in the same manner as the magnetization in the second magnetic layer 102 of the magnetoresistive effect element 112 in Embodiment 5. When the current having the second current density and flowing in the direction reversed to the direction of the current having the first current density is applied to the magnetoresistive effect element 410, the magnetization in the ferromagnetic nano-contact is rapidly oriented toward the direction of the effective magnetic field, and rotation of the magnetic domain wall is stopped. Hence the oscillation disappears. Thus, the fall of the oscillation can be sped up in Embodiment 6.

(Embodiment 7)

In this embodiment, a magnetoresistive effect oscillator is assumed to be the same as that in Embodiment 1 except for the operation of the current source 113.

The operation of the current source 113 controlled by the control unit 115 in Embodiment 7 is described below. The current source 113 performs, as the operation for the rise of the oscillation, operation including the first to third steps as in Embodiment 1. In the first step, the current source 113 applies or does not apply, to the magnetoresistive effect element 112, a current having a current density not more than the critical current density $j_S$ for stationary such that the operating point of the magnetoresistive effect element 112 is positioned in the region where only the static condition is stabilized. In the second step, the current source 113 applies, to the magnetoresistive effect element 112, a current flowing in the positive direction and having a first current density that is larger than the critical current density for oscillation. In the third step, the current source 113 applies, to the magnetoresistive effect element 112, a current flowing in the positive direction and having a second current density that is less than the first current density and not less than the critical current density for oscillation.

Next, as the operation of the current source 113 for the fall of the oscillation, in the oscillating condition of the magnetoresistive effect element 112 with application of the current flowing in the positive direction and having the second current density to the magnetoresistive effect element 112, the current source 113 applies a current flowing in the negative direction, which is reversed to the direction of the current having the second current density, to the magnetoresistive effect element 112, thus making the oscillation of the magnetoresistive effect element 112 disappeared as in Embodiment 5. Thereafter, the current source 113 applies a current having a current density smaller than the critical current density $j_O$ for oscillation to the magnetoresistive effect element 112, or stops the application of the current in order to sustain the oscillation disappeared state of the magnetoresistive effect element 112.

By employing Embodiment 7, the rise and the fall of the oscillation can be sped up through mechanisms similar to those in Embodiments 1 and 5.

While a combination of Embodiments 1 and 5 has been described in Embodiment 7, Embodiment 2 or 3 may be combined with Embodiment 5, or Embodiment 4 may be combined with Embodiment 6.

EXAMPLE 1

FIG. 1 is a schematic view of the magnetoresistive effect element according to EXAMPLE 1. The magnetoresistive effect element 112 includes the first magnetic layer 101, the spacer layer 103, and the second magnetic layer 102. The first electrode 110 is disposed to be electrically connected to the first magnetic layer, and the second electrode 111 is disposed to be electrically connected to the second magnetic layer 102. The second magnetic layer 102 has an elliptic shape with a major axis of 135×minor axis of 65×thickness of 2.5 nm³. It is here assumed that the x-axis direction is a direction of the major axis, the y-axis direction is a direction of the minor axis, and the z-axis direction is a direction of thickness. The first magnetic layer 101 and the second magnetic layer 102 are each made of $Ni_{80}Fe_{20}$. The magnetization in the first magnetic layer 101 is fixed through exchange coupling with an antiferromagnetic substance FeMn, not illustrated, which is positioned immediately under the first magnetic layer 101, such that the magnetization is fixed in the direction of the arrow 104. The spacer layer is made of nonmagnetic metal Cu. The current source 103 is connected between the first electrode 110 and the second electrode 111, and a current I in the positive direction is applied in the direction perpendicular to the film surface of the magnetoresistive effect element 112.

The magnetoresistive effect element 112 has magnetic shape anisotropy in the x-axis direction, and its anisotropic magnetic field is set to 29.05×10³ A/m. Furthermore, because the film thickness can be regarded as being sufficiently thin, demagnetization factors are set as Nx=0, Ny=0, and Nz=1.

Table 1 lists parameters used in EXAMPLE 1.

TABLE 1

| Symbol | Meaning | Value | Unit |
|---|---|---|---|
| γ | Gyromagnetic ratio | 2.2176 × 10⁵ | m/(A · sec) |
| α | Gilbert damping constant | 0.01 | — |
| $H_K$ | Anisotropic magnetic field | 29.05 × 10³ | A/m |
| Ms | Saturated magnetization | 8 × 10⁵ | A/m |
| P | Spin polarization efficiency | 0.3 | — |

A dynamics MR ratio $MR_D$ implies a ratio of a dynamic resistance change value to a resistance change value in the static condition between when the direction of magnetization in the first magnetic layer 101 and the direction of magnetization in the second magnetic layer 102 are parallel and when both the magnetization directions are antiparallel. The dynamics MR ratio $MR_D$ is calculated by employing the following formula.

[Math. 5]

$$MR_D = \frac{R_{osc}}{R_{max} - R_{min}} = \frac{1 - \cos\theta}{2} \quad (5)$$

Here, $R_{OSC}$ is a dynamic resistance change value, $R_{max}$ is a resistance value when the direction of magnetization in the first magnetic layer 101 and the direction of magnetization in the second magnetic layer 102 are antiparallel, $R_{min}$ is a resistance value when the direction of magnetization in the first magnetic layer 101 and the direction of magnetization in the second magnetic layer 102 are parallel, and θ is an angle formed between the direction of the effective magnetic field in the second magnetic layer 102 and the direction of magnetization in the second magnetic layer 102 when the current is applied.

A condition in which the dynamics MR ratio is 0.1% or more in the steady state is defined as the oscillating condition.

A condition in which the dynamics MR ratio is less than 0.1% in the steady state is defined as the static condition.

A rise time of the oscillation is defined as a time from the start of application of a current to the magnetoresistive effect element 112 for the rise of the oscillation until fluctuations of an oscillation frequency are reduced to 1% or less of the oscillation frequency in the steady state. In EXAMPLE 1, later-described EXAMPLES 2-4 and 7, and later-described COMPARATIVE EXAMPLES 1-5, the time of starting the application of the current to the magnetoresistive effect element for the rise of the oscillation is set to 0 sec.

Figure 7A:
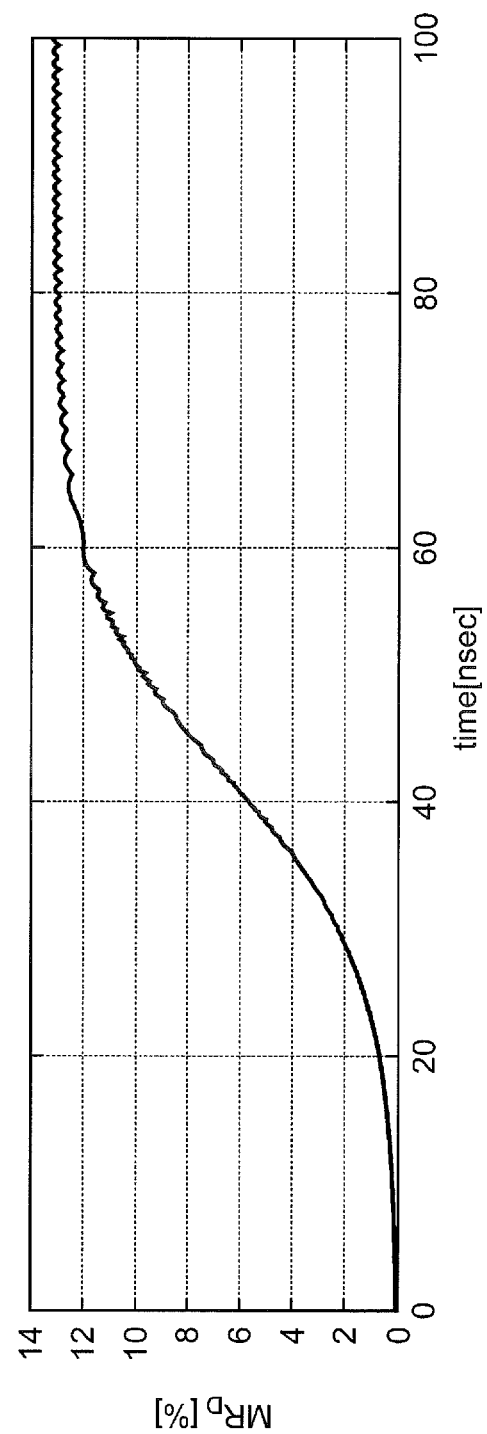
FIG. 7a is a graph representing the calculation result of a critical current density for oscillation in EXAMPLE 1 of the present invention.
Figure 7B:
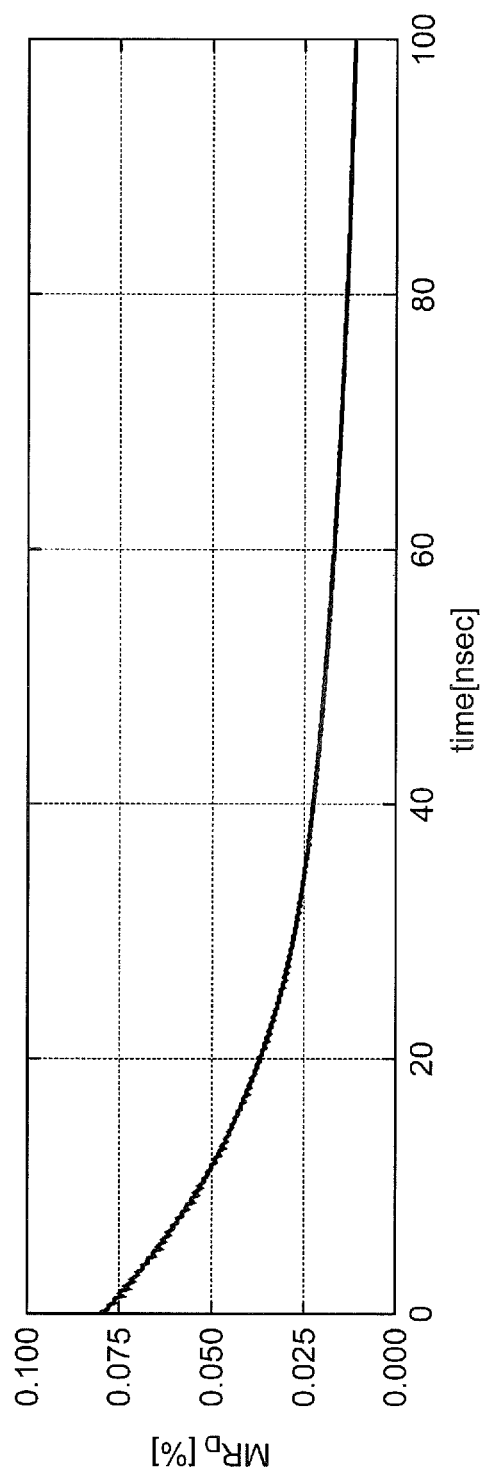
FIG. 7b is a graph representing the calculation result of a critical current density for oscillation in EXAMPLE 1 of the present invention.

FIGS. 7a and 7b represent time-dependent changes of the dynamics MR ratio $MR_D$ when a constant current in the positive direction is applied, starting from a state where no current is applied to the magnetoresistive effect element 112 of EXAMPLE 1 and the direction of magnetization in the second magnetic layer 102 is oriented in the direction of the effective magnetic field. FIG. 7a represents the result when the current density was $1.1 \times 10^{11}$ A/m². The amplitude of $MR_D$ was gradually increased, thus resulting in the oscillating condition. On the other hand, FIG. 7b represents the result when the current density was $1.0 \times 10^{10}$ A/m². The amplitude of $MR_D$ was gradually reduced, thus resulting in the static condition. Accordingly, the critical current density for oscillation was about $1.1 \times 10^{11}$ A/m².

Figure 8A:
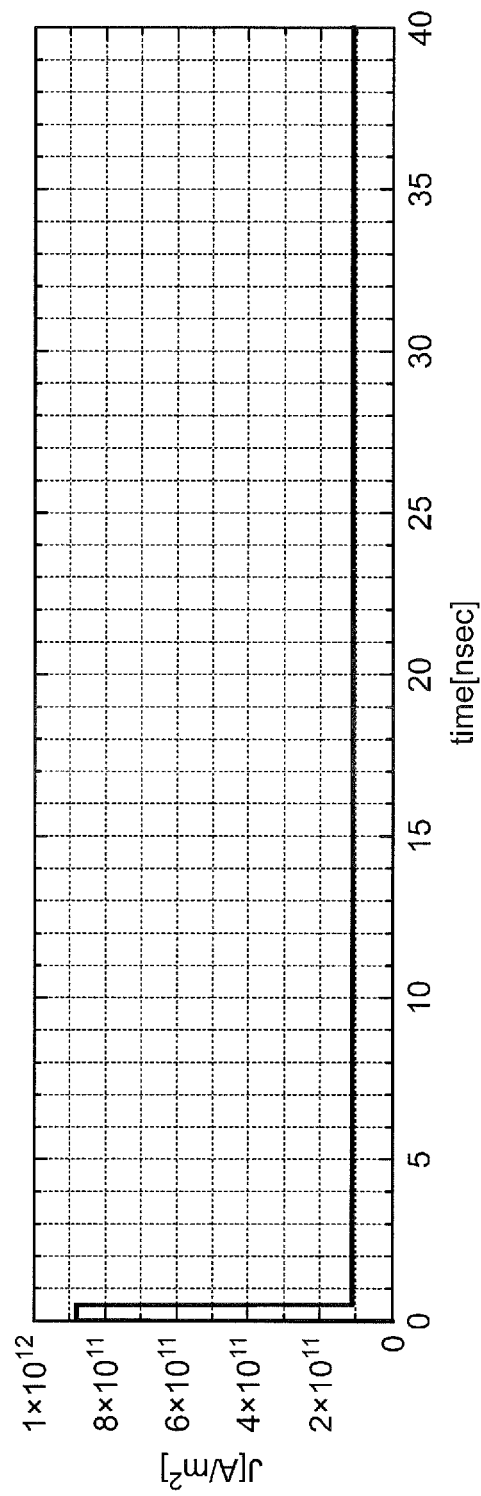
FIG. 8a is a graph representing an applied current density in EXAMPLE 1 of the present invention.

For the rise of the oscillation, the magnetoresistive effect oscillator 100 was driven by controlling the current source 113 in accordance with the following steps in EXAMPLE 1. FIG. 8a represents time-dependent change of the applied current in EXAMPLE 1. In a first step, no current was applied to the magnetoresistive effect element 112. In a second step, a current flowing in the positive direction at $8.8 \times 10^{11}$ A/m², larger than the critical current density for oscillation, was applied for 0.5 nanosecond (nsec) in the state where the direction of magnetization in the second magnetic layer 102 was oriented in the direction of the effective magnetic field. Thereafter, in a third step, a current flowing in the positive direction and having the critical current density for oscillation, i.e., $1.1 \times 10^{11}$ A/m², was applied.

Figure 8B:
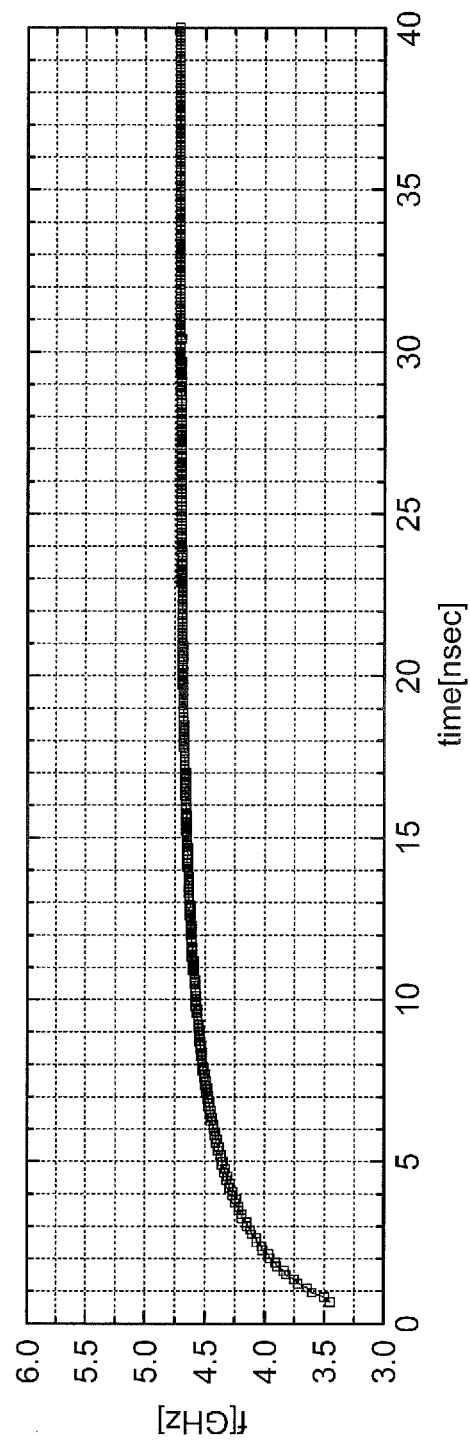
FIG. 8b is a graph representing the calculation result of a rise of oscillation in EXAMPLE 1 of the present invention.

FIG. 8b depicts the calculation result representing time-dependent change of the oscillation frequency of the magnetoresistive effect element 112, which is resulted from the above-described operation. The oscillation frequency at the start of application of the current was 3.5 GHz, and the oscillation occurred at a comparatively low frequency. The reason is presumably in that, by applying the comparatively large current in the first step, the spin-transfer torque is developed to act strongly, and vibration of large amplitude is generated, thus causing the oscillation at a low frequency. After shifting to the third step, the torque was weakened, and the amplitude of precession of the magnetization was reduced. Consequently, the oscillation frequency was changed to a higher frequency, and the oscillation was stabilized at a frequency of 4.7 GHz. The rise time was 17 nsec.

COMPARATIVE EXAMPLE 1

Figure 9A:
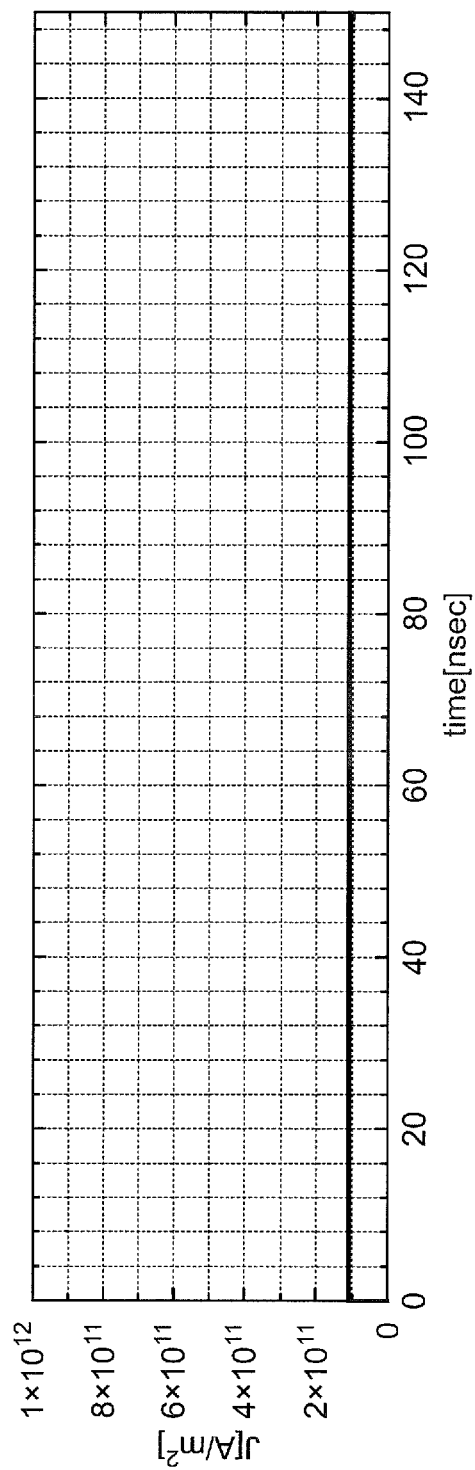
FIG. 9a is a graph representing an applied current density in COMPARATIVE EXAMPLE 1 as compared with the present invention.
Figure 9B:
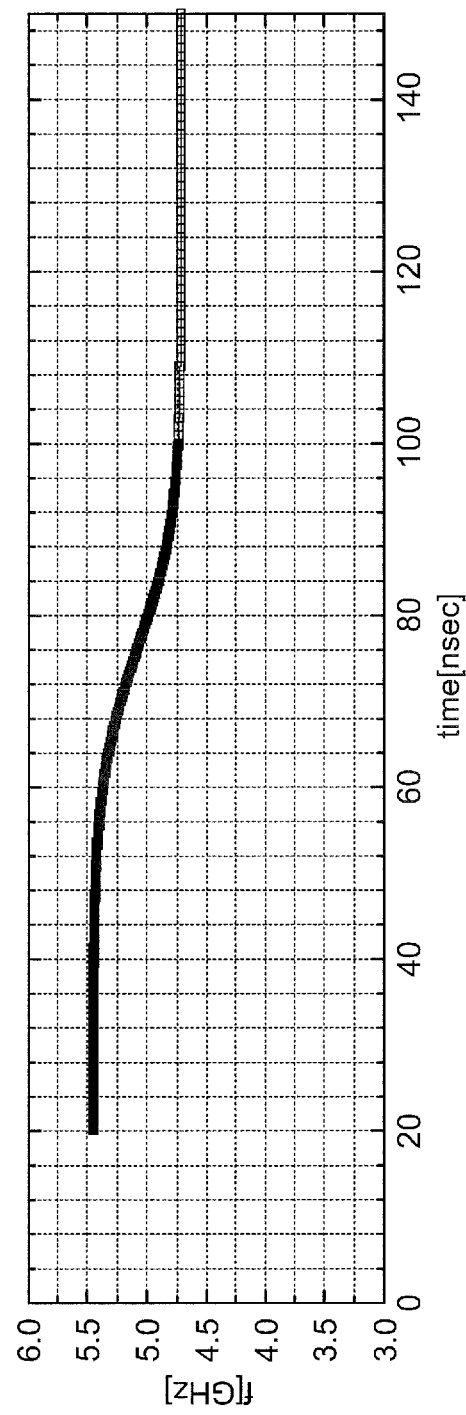
FIG. 9b is a graph representing the calculation result of a rise of oscillation in COMPARATIVE EXAMPLE 1 as compared with the present invention.

The result obtained in the case where the second step is omitted in EXAMPLE 1 is described as COMPARATIVE EXAMPLE. FIG. 9a represents time-dependent change of the applied current density, and FIG. 9b depicts the calculation result representing time-dependent change of the oscillation frequency in COMPARATIVE EXAMPLE 1. After zero second, a constant current flowing in the positive direction and having the critical current density for oscillation, i.e., $1.1 \times 10^{11}$ A/m², was applied to the magnetoresistive effect element. Because the spin-transfer torque and the damping are just balanced at the critical current density for oscillation, a longer time was taken until stable oscillation was obtained, and the rise time was 98 nsec.

Comparing the rise times in EXAMPLE 1 and COMPARATIVE EXAMPLE 1, the rise time in COMPARATIVE EXAMPLE 1 is 98 nsec, whereas the rise time in EXAMPLE 1 is 17 nsec. Thus, in the magnetoresistive effect oscillator 100 of EXAMPLE 1, the rise is about 5 times faster than that in COMPARATIVE EXAMPLE 1.

EXAMPLE 2

EXAMPLE 2 represents a specific example in which the magnetoresistive effect element is constituted as the NCMR element. The magnetoresistive effect oscillator 400 of EXAMPLE 2 includes the magnetoresistive effect element 410 including the first magnetic layer 401, the second magnetic layer 402, and the spacer layer 409 arranged between them. The magnetoresistive effect oscillator 400 further includes the first electrode 407 in contact with the first magnetic layer 401, and the second electrode 408 in contact with the second magnetic layer 402. The current source 411 is connected between the first electrode 407 and the second electrode 408. The spacer layer 409 includes the insulating portion 403 and the ferromagnetic nano-contact regions 404. The first magnetic layer 401, the second magnetic layer 402, and the ferromagnetic nano-contact regions 404 are each made of $Fe_{50}Co_{50}$. The ferromagnetic nano-contact region 404 has a length of 1.3 nm and an area of 1 nm². The insulating layer 403 is made of $Al_2O_3$ as a main component. An antiferromagnetic layer made of $Ir_{20}Mn_{80}$ is positioned immediately under the first magnetic layer 401 in contact therewith, and is exchange-coupled with the first magnetic layer 401. As a result, the direction of magnetization in the first magnetic layer 401 is fixed and oriented in the direction of the arrow 405. The direction of magnetization in the second magnetic layer 402 is fixed and oriented in the direction of the arrow 406 by an externally applied magnetic field. Because the directions of the arrow 405 and the arrow 406 are not parallel, a magnetic domain wall is formed in the ferromagnetic nano-contact region 404. When the current I is applied to the magnetoresistive effect element 410 through the electrodes to flow in a direction perpendicular to the individual layers, the spin-transfer torque acts on the magnetic domain wall, thus generating a microwave.

A modeling process similar to that in Embodiment 4 is employed to calculate an oscillation phenomenon of the magnetoresistive effect element 410.

Table 2 lists parameters used in the calculation.

TABLE 2

| Symbol | Meaning | Value | Unit |
|---|---|---|---|
| γ | Gyromagnetic ratio | $2.2176 \times 10^5$ | m/(A · sec) |
| α | Gilbert damping constant | 0.02 | — |
| A | Exchange coupling constant | $1.3 \times 10^{-11}$ | J/m |
| Ms | Saturated magnetization | $8 \times 10^5$ | A/m |
| P | Spin polarization efficiency | 1 | — |

In EXAMPLE 2, the applied current density is assumed to be a value in one ferromagnetic nano-contact.

The applied current density can be estimated by the following method. The method includes the steps of making the spacer layer 409 of the magnetoresistive effect element 410 exposed, observing the exposed surface by a conductive atomic force microscopy (c-AFM), and evaluating a total area of the nano-contact in the exposed surface from a conductive region. The current density in the nano-contact can be estimated by dividing a current value applied to the magnetoresistive effect element 410 by the total area of the nano-contact.

Figure 6B:
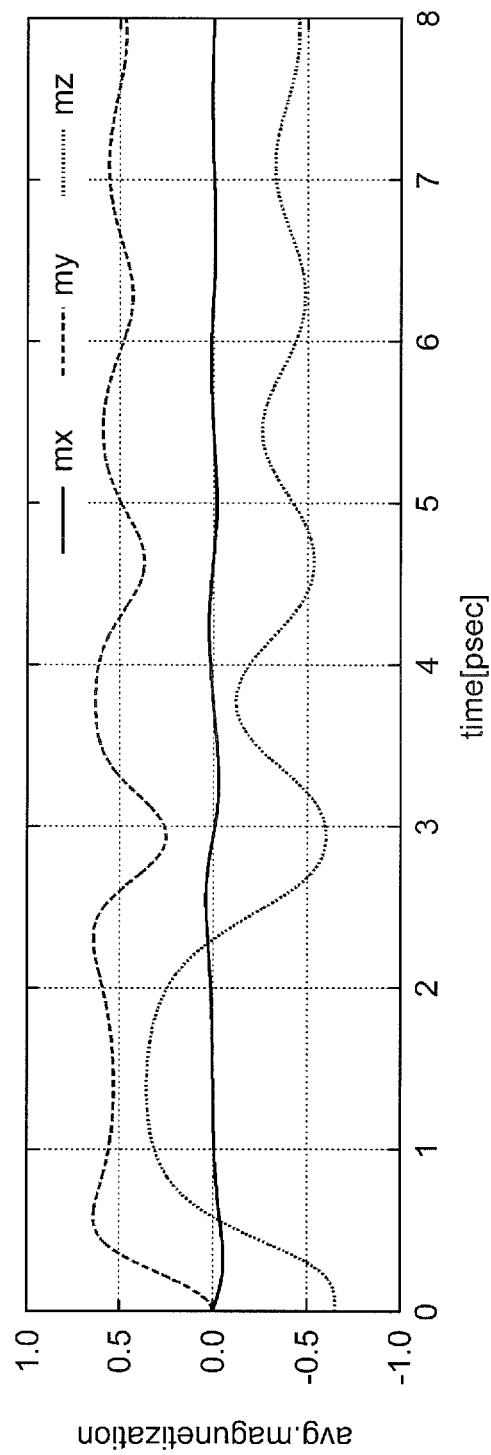
FIG. 6b is a graph representing the calculation result of a critical current density for oscillation in EXAMPLE 2 of the present invention.

FIGS. 6a and 6b represent the calculation results of time-dependent changes of an average value of a magnetization vector in the ferromagnetic nano-contact when a constant current in the positive direction is applied starting from the state where no current is applied to the magnetoresistive effect element 410. FIG. 6a represents the result when the current density was $2.66 \times 10^{12}$ A/m$^2$. After 6 psec, the Neel wall and the Bloch wall alternately transited from one to the other, and stable precession occurred. On the other hand, FIG. 6b represents the result when the current density was $2.65 \times 10^{12}$ A/m$^2$. Stable precession did not occur. Accordingly, the critical current density for oscillation was about $2.66 \times 10^{12}$ A/m$^2$.

Figure 10A:
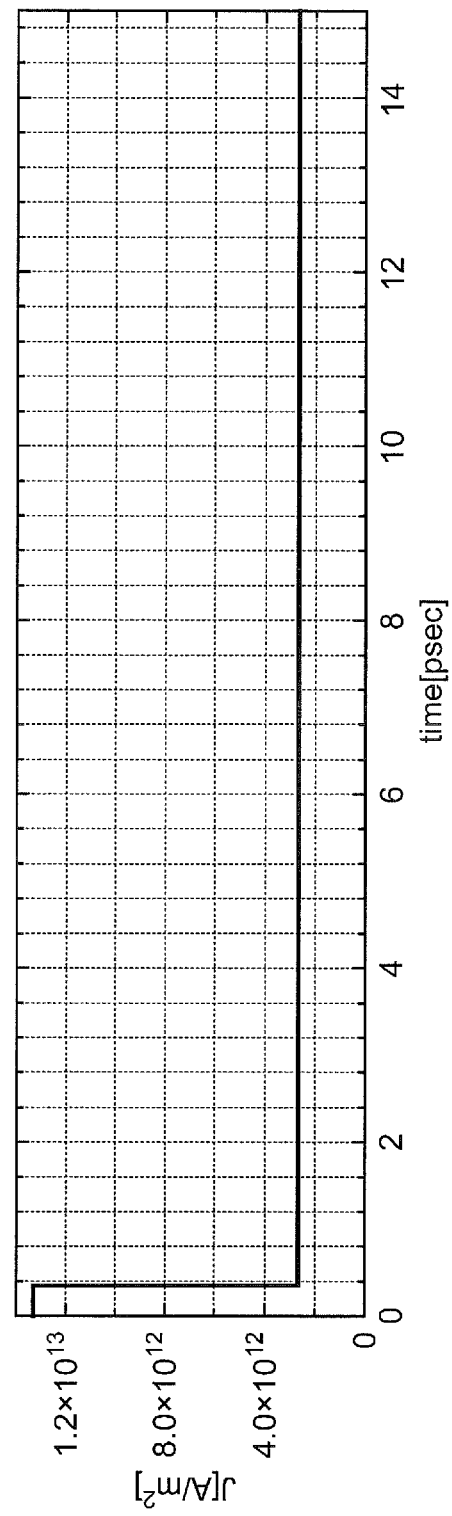
FIG. 10a is a graph representing an applied current density in EXAMPLE 2 of the present invention.

The operation of the current source controlled by the control unit for the rise of the oscillation in EXAMPLE 2 is described below. FIG. 10a represents time-dependent change of the applied current in EXAMPLE 2. In the first step, no current was applied. Then, in the second step, a current flowing in the positive direction and having the current density of $13.3 \times 10^{12}$ A/m$^2$ was applied to the magnetoresistive effect element 410 for 0.35 psec. Then, in the third step, a current flowing in the positive direction and having the critical current density for oscillation, i.e., $2.66 \times 10^{12}$ A/m$^2$, was applied.

Figure 10B:
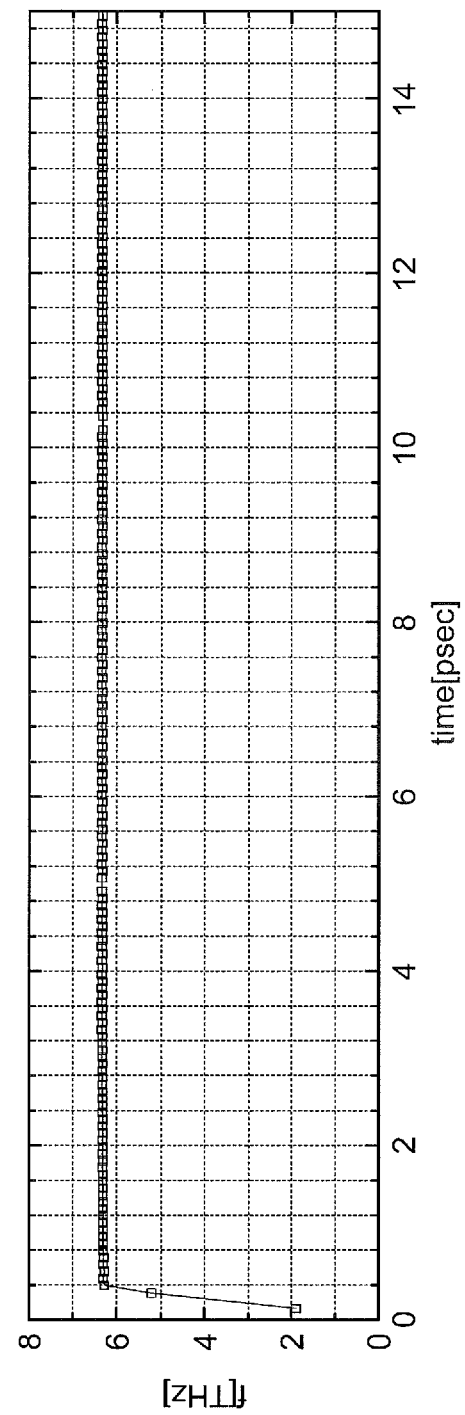
FIG. 10b is a graph representing the calculation result of a rise of oscillation in EXAMPLE 2 of the present invention.

FIG. 10b is a graph representing time-dependent change of the oscillation frequency in EXAMPLE 2. The oscillation occurred at a constant frequency of 6.2 THz in the steady state, and the rise time was 0.5 psec.

COMPARATIVE EXAMPLE 2

Figure 11A:
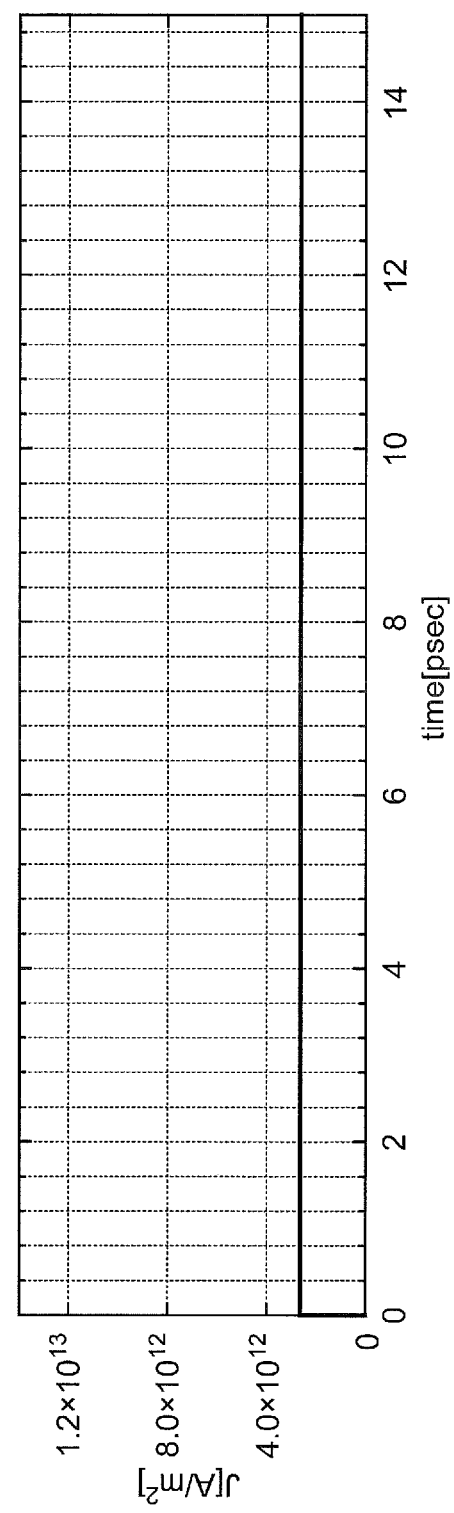
FIG. 11a is a graph representing an applied current density in COMPARATIVE EXAMPLE 2 as compared with the present invention.

The case in which the second step in EXAMPLE 2 is omitted is described as COMPARATIVE EXAMPLE. FIG. 11a represents the applied current density at an arbitrary point in time, which was applied to the magnetoresistive effect element 410 in COMPARATIVE EXAMPLE 2. A current flowing in the positive direction and having the critical current density for oscillation, i.e., $2.66 \times 10^{12}$ A/m$^2$, was applied continuously.

Figure 11B:
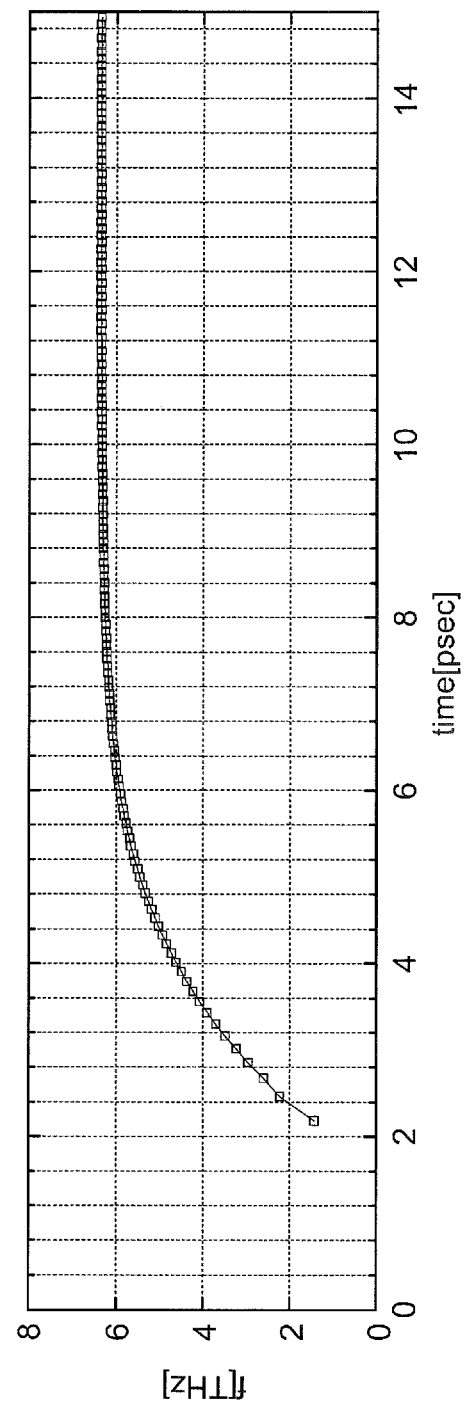
FIG. 11b is a graph representing the calculation result of a rise of oscillation in COMPARATIVE EXAMPLE 2 as compared with the present invention.

FIG. 11b represents time-dependent change of the oscillation frequency of the magnetoresistive effect element 410 that caused oscillation with the operation in COMPARATIVE EXAMPLE 2. The frequency was gradually increased and finally stabilized at a constant frequency of 6.2 THz, thus causing oscillation. The rise time was 8.8 psec.

Comparing the rise times of the oscillations in EXAMPLE 2 and COMPARATIVE EXAMPLE 2, the rise time in EXAMPLE 2 is 0.5 psec, whereas the rise time in COMPARATIVE EXAMPLE 2 is 8.8 psec. Accordingly, by employing the magnetoresistive effect oscillator of EXAMPLE 2, the rise of the oscillation can be sped up about 16 times that obtained with the method of applying the constant current to the magnetoresistive effect element 410.

COMPARATIVE EXAMPLE 3

An example using the operation method disclosed in PTL 1 is described as COMPARATIVE EXAMPLE 3. PTL 1 discloses the method of operating a magnetoresistive effect element through a first step of making the operating point of the magnetoresistive effect element positioned in the region of bistability, a second step of increasing a current, which is applied to the magnetoresistive effect element, in excess of the critical current density for oscillation, and a third step of reducing the current, which is applied to the magnetoresistive effect element, below the critical current density for oscillation.

Figure 12A:
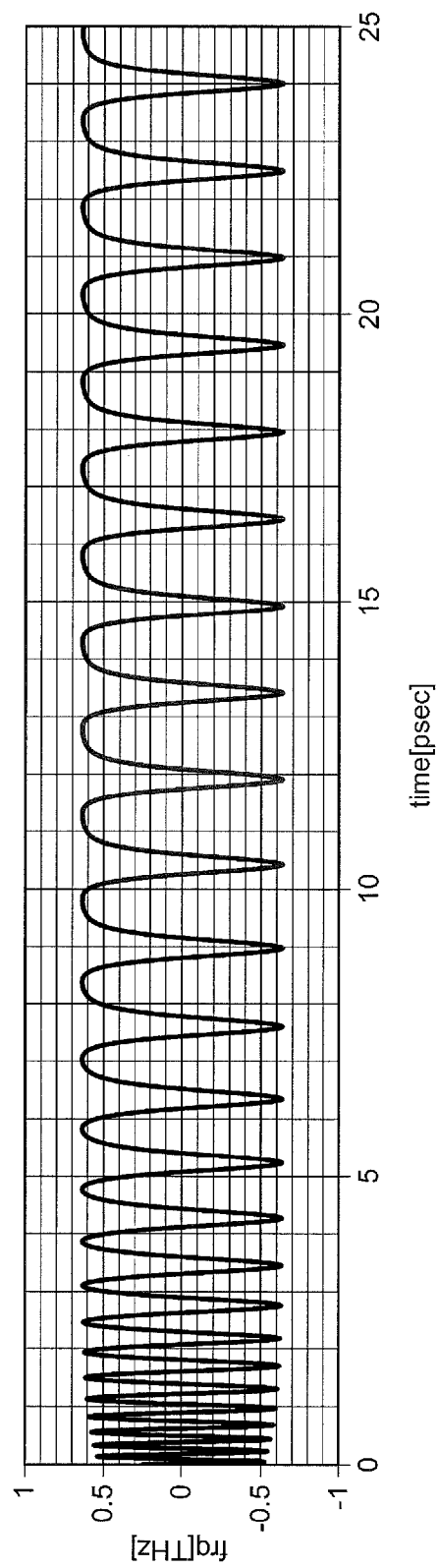
FIG. 12a is a graph representing the calculation result of time-dependent change of a magnetization vector near a region of bistability in EXAMPLE 2 of the present invention.
Figure 12B:
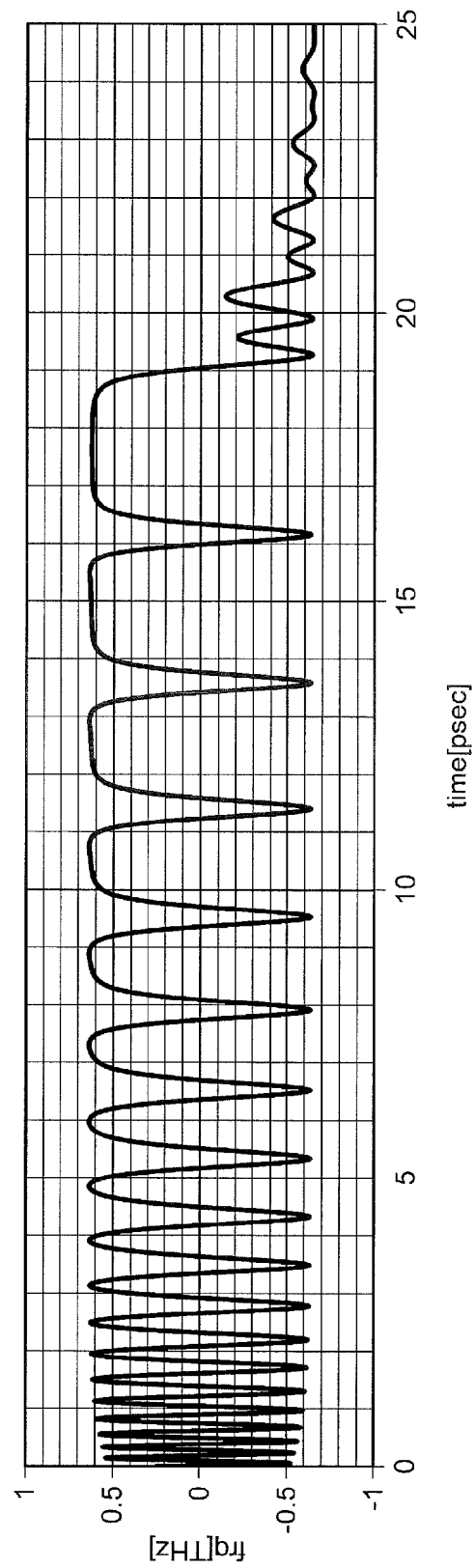
FIG. 12b is a graph representing the calculation result of time-dependent change of the magnetization vector near the region of bistability in EXAMPLE 2 of the present invention.

COMPARATIVE EXAMPLE 3 is different from EXAMPLE 2 in the operation of the current source, but the other configuration is the same as that in EXAMPLE 2. A range of the current density at which the operating point of the magnetoresistive effect element 410 is positioned in the region of bistability was calculated by the following method. Through simulation, a current flowing in the positive direction and having the critical current density for oscillation, i.e., $2.66 \times 10^{12}$ A/m$^2$, was first applied to the magnetoresistive effect element 410 as the first step until the oscillation of the magnetoresistive effect element 410 came into a steady state, and the applied current density was then gradually reduced little by little, to thereby determine the current density at which the static condition was obtained in a steady state. FIG. 12a represents time-dependent change of the magnetization vector when a current flowing in the positive direction and having the current density of $5.80 \times 10^{11}$ A/m$^2$ was applied to the magnetoresistive effect element 410. As seen from FIG. 12a, the oscillation was sustained. On the other hand, FIG. 12b represents time-dependent change of the magnetization vector when a current flowing in the positive direction and having the current density of $5.70 \times 10^{11}$ A/m$^2$ was applied. After 20 psec, rotation of the magnetic domain wall was stopped, and the oscillation disappeared. Thus, the critical current density for stationary is about $5.70 \times 10^{11}$ A/m$^2$, and the operating point of the magnetoresistive effect element 410 is positioned in the region of bistability when a current flowing in the positive direction and having the current density of not less than $5.80 \times 10^{11}$ A/m$^2$ and less than $2.66 \times 10^{12}$ A/m$^2$ is applied.

Figure 13A:
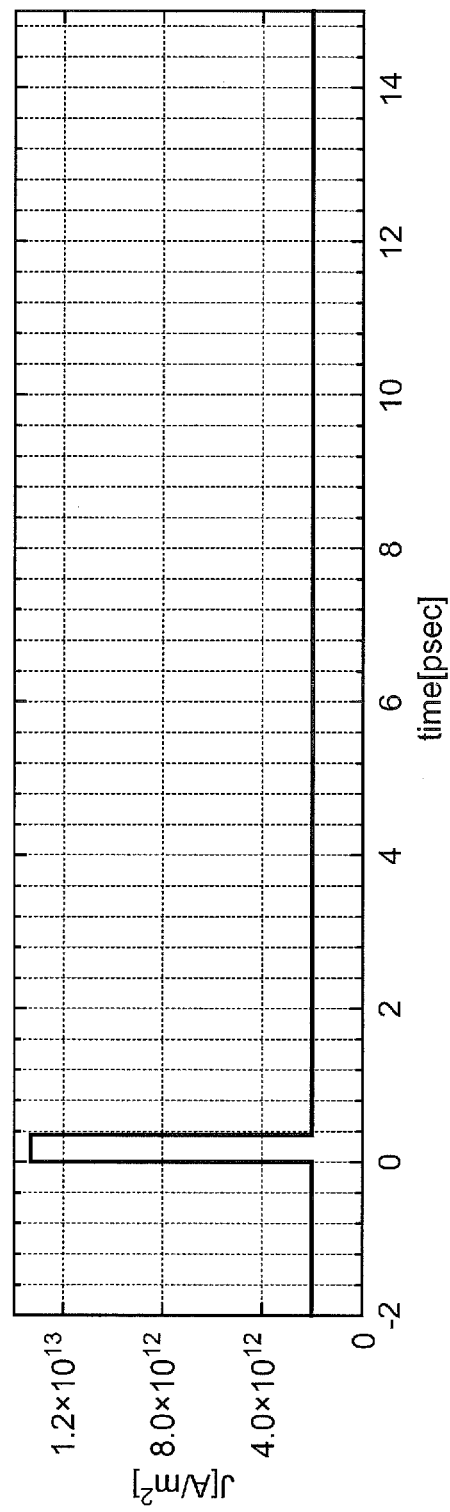
FIG. 13a is a graph representing an applied current density in COMPARATIVE EXAMPLE 3 as compared with the present invention.

FIG. 13a represents time-dependent change of the current applied to the magnetoresistive effect element 410 in accordance with the operation method of COMPARATIVE EXAMPLE 3. As the first step, a current flowing in the positive direction and having the current density of $1.99 \times 10^{12}$ A/m$^2$ was applied to the magnetoresistive effect element 410, thus making the operating point of the magnetoresistive effect element 410 positioned in the region of bistability. Then, in the second step, a current flowing in the positive direction and having the current density of $13.3 \times 10^{12}$ A/m$^2$ was applied for 0.35 psec. Then, in the third step, a current flowing in the positive direction at $1.99 \times 10^{12}$ A/m$^2$, lower than the critical current density for oscillation, was applied to the magnetoresistive effect element 410, thus making the operating point of the magnetoresistive effect element 410 positioned in the region of bistability.

Figure 13B:
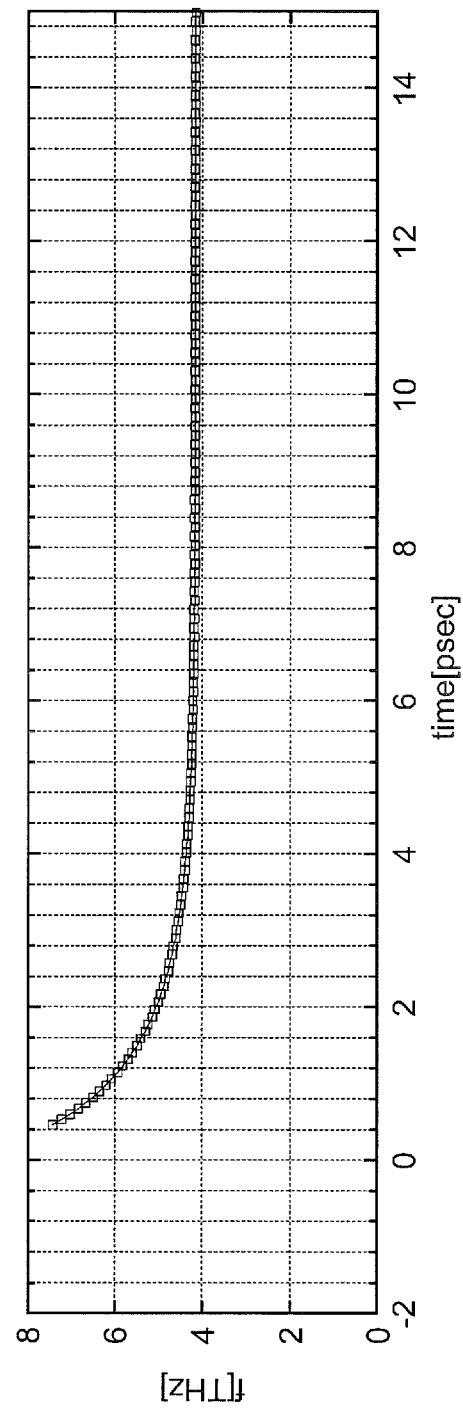
FIG. 13b is a graph representing the calculation result of a rise of oscillation in COMPARATIVE EXAMPLE 3 as compared with the present invention.

FIG. 13b is a graph representing time-dependent change of the oscillation frequency resulted with the operation method of COMPARATIVE EXAMPLE 3. The oscillation occurred at 4 THz in the steady state, and the rise time was 6 psec.

Comparing the rise times of the oscillations in EXAMPLE 2 and COMPARATIVE EXAMPLE 3, the rise time in EXAMPLE 2 is 0.5 psec, whereas the rise time in COMPARATIVE EXAMPLE 3 is 4 psec. Accordingly, by employing the magnetoresistive effect oscillator of EXAMPLE 2, the rise of the oscillation can be sped up about 8 times that obtained with the operation method disclosed in PTL 1. The reason is presumably in that a difference between the current density applied to the magnetoresistive effect element 410 in the second step and the current density applied in the third step is smaller in EXAMPLE 2 than in COMPARATIVE EXAMPLE 3, and that the first transition time is shorter in EXAMPLE 2.

EXAMPLE 3

This EXAMPLE represents the case where a current is applied to the magnetoresistive effect element as the first step such that the operating point of the magnetoresistive effect element is positioned in the region in which only the oscillating conditions can be stabilized. The magnetoresistive effect element is the same as that in EXAMPLE 2.

Figure 14A:
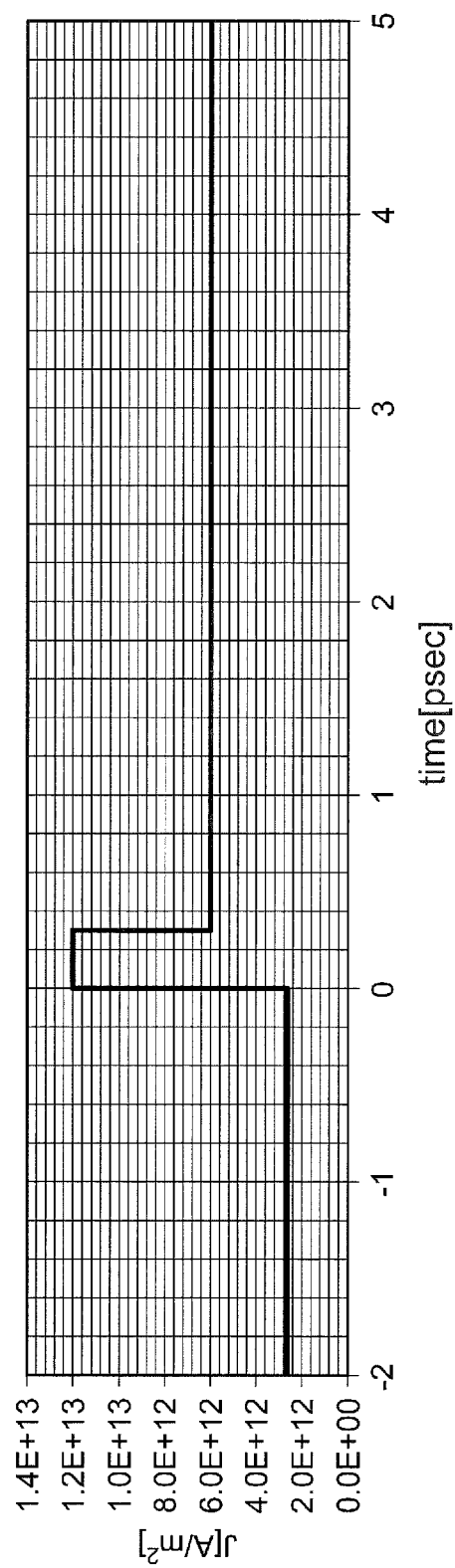
FIG. 14a is a graph representing an applied current density in EXAMPLE 3 of the present invention.

FIG. 14a represents steps of applying currents to the magnetoresistive effect element 410 in EXAMPLE 3. As the first step, a current flowing in the positive direction and having the critical current density for oscillation, i.e., $2.66 \times 10^{12}$ A/m$^2$, was applied. Then, as the second step, a current flowing in the positive direction and having the current density of $12.0 \times 10^{12}$ A/m$^2$ was applied for 0.3 psec. Then, as the third step, a current flowing in the positive direction at $6.0 \times 10^{12}$ A/m$^2$ was applied after the lapse of 0.3 psec.

Figure 14B:
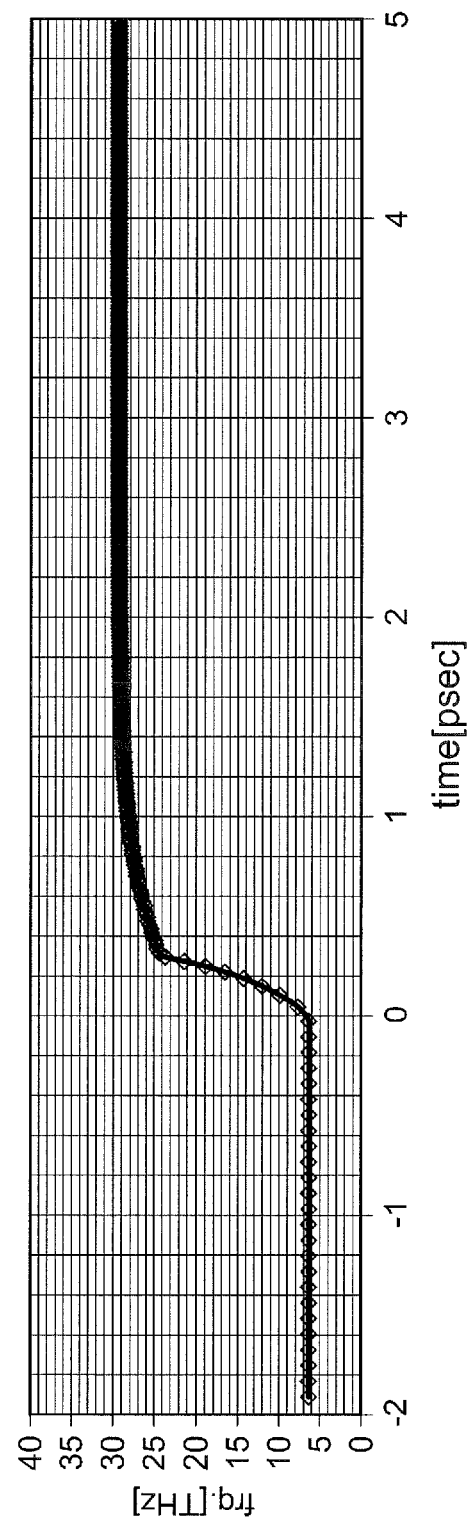
FIG. 14b is a graph representing the calculation result of a rise of oscillation in EXAMPLE 3 of the present invention.

FIG. 14b represents the simulation result of time-dependent change of the oscillation frequency when the magnetoresistive effect oscillator was driven in accordance with the above-mentioned current steps. The oscillation occurred at about 30 THz in the steady state, and the rise time was 1.6 psec.

COMPARATIVE EXAMPLE 4

Figure 15A:
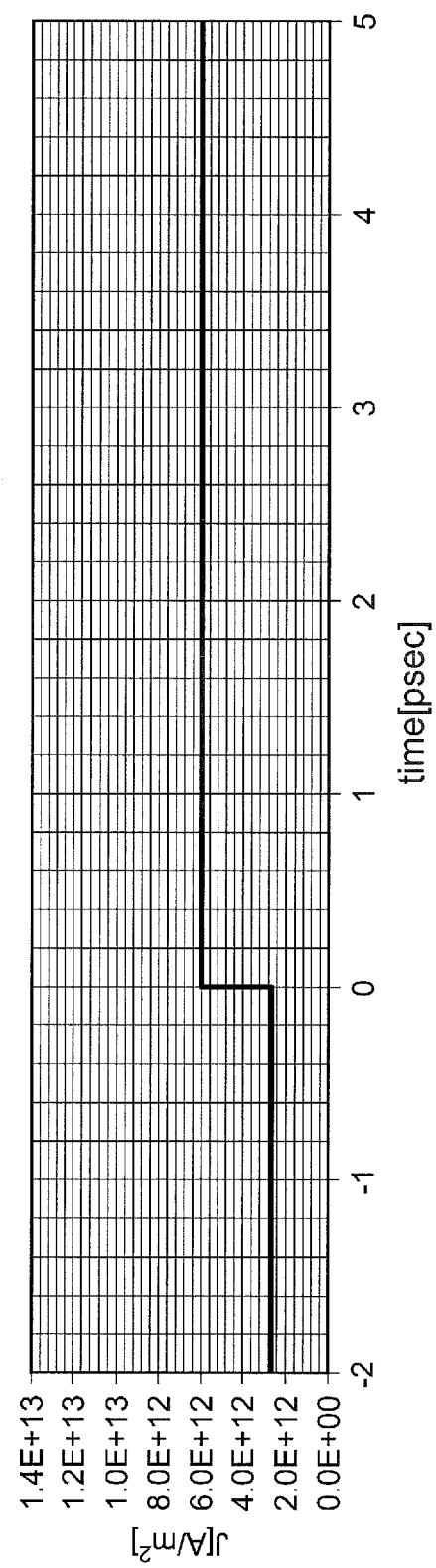
FIG. 15a is a graph representing an applied current density in COMPARATIVE EXAMPLE 4 as compared with the present invention.

The case of employing the magnetoresistive effect element 410, which is the same as that in EXAMPLE 3, with omission of the second step in EXAMPLE 3, is described for comparison with EXAMPLE 3. FIG. 15a represents the current applied to the magnetoresistive effect element 410 in COMPARATIVE EXAMPLE 4. As the first step, a current flowing in the positive direction and having the critical current density for oscillation, i.e., $2.66 \times 10^{12}$ A/m$^2$, was applied to the magnetoresistive effect element 410. Then, a current flowing in the positive direction and having the constant current density of $6.0 \times 10^{12}$ A/m$^2$ was applied.

Figure 15B:
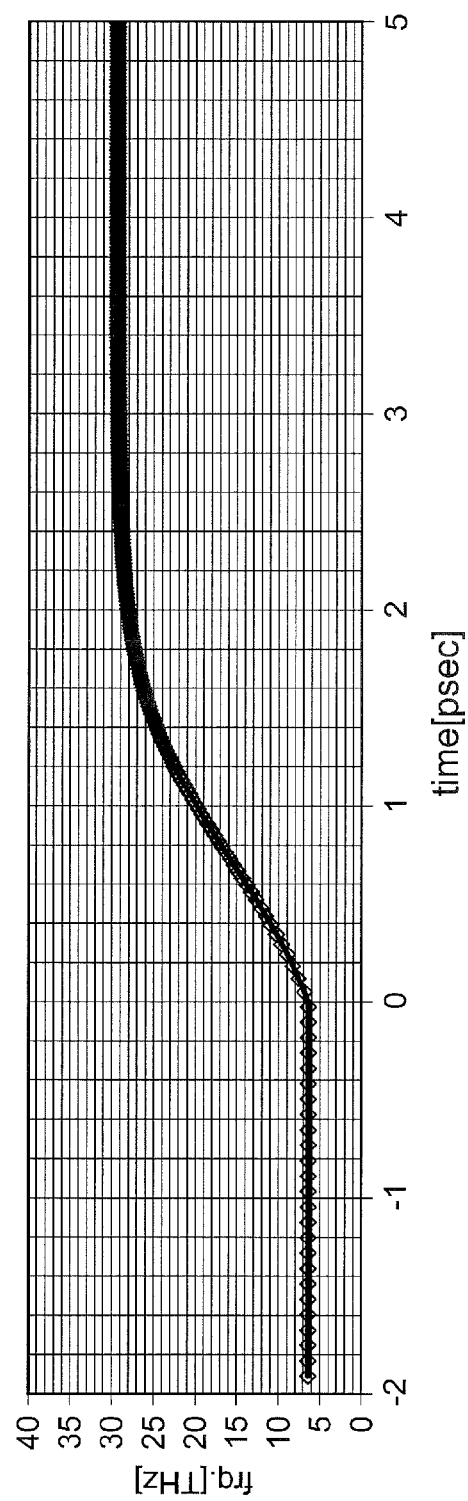
FIG. 15b is a graph representing the calculation result of a rise of oscillation in COMPARATIVE EXAMPLE 4 as compared with the present invention.

FIG. 15b represents the simulation result of time-dependent change of the oscillation frequency when the magnetoresistive effect oscillator was driven in accordance with the above-mentioned current steps. The oscillation occurred at about 30 THz in the steady state, and the rise time was 2.6 psec.

Comparing the rise times of the oscillations in EXAMPLE 3 and COMPARATIVE EXAMPLE 4, the rise time in EXAMPLE 3 is shorter by about 1 psec. Hence EXAMPLE 3 is more suitable for use in high-speed communications. Such a result is presumably attributable to the fact that, in EXAMPLE 3, since a comparatively large current is applied to the magnetoresistive effect element 410 as the second step, local magnetization in each nano-contact is fluctuated to a large extent and is transited to an oscillation orbit resulting upon application of the second current. On the other hand, in COMPARATIVE EXAMPLE 4, the local magnetization is gradually transited from the oscillation orbit resulting in the second step to the oscillation orbit resulting upon application of the current having the current density of $6.0 \times 10^{12}$ A/m$^2$. Thus, a longer time is taken for the rise of the oscillation.

EXAMPLE 4

Figure 16A:
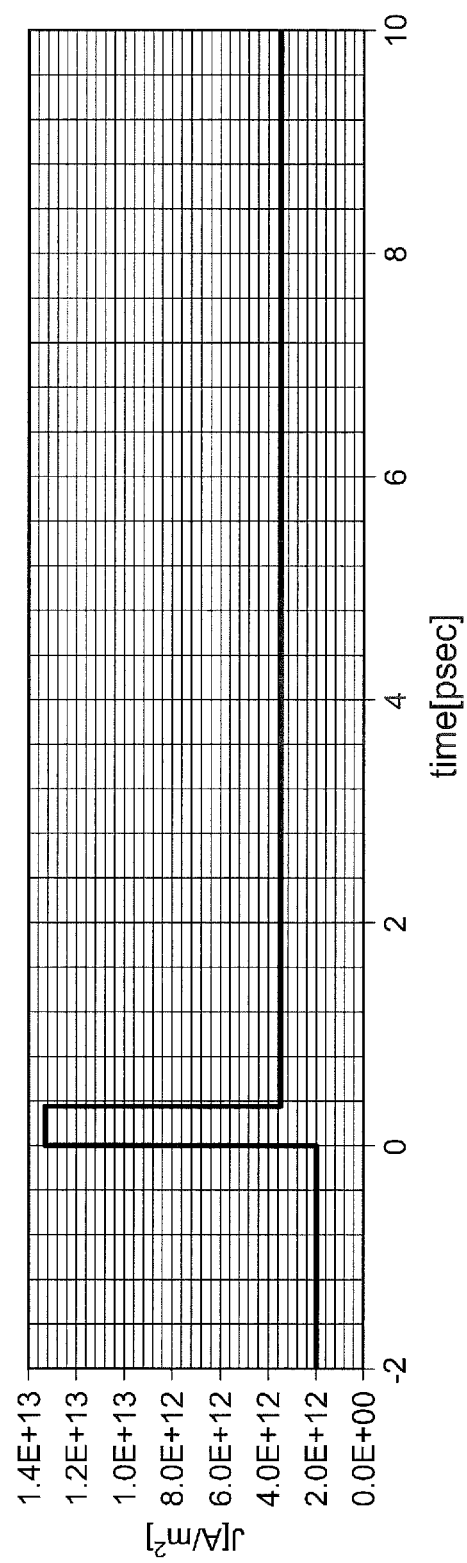
FIG. 16a is a graph representing an applied current density in EXAMPLE 4 of the present invention.

This EXAMPLE represents the case where a current is applied to the magnetoresistive effect element 410 as the first step such that the operating point of the magnetoresistive effect element 410 is positioned in the region of bistability. The magnetoresistive effect element is the same as that in EXAMPLE 2. FIG. 16a represents time-dependent change of the current density applied to the magnetoresistive effect element 410 in EXAMPLE 4. As the first step, a current flowing in the positive direction and having the current density of $1.99 \times 10^{12}$ A/m$^2$ was applied to make the operating point of the magnetoresistive effect element 410 positioned in the region of bistability. Then, as the second step, a current flowing in the positive direction and having the current density of $13.3 \times 10^{12}$ A/m$^2$ was applied for 0.35 psec. Then, as the third step, a current flowing in the positive direction and having the critical current density for oscillation, i.e., $3.50 \times 10^{12}$ A/m$^2$, was applied to the magnetoresistive effect element 410.

Figure 16B:
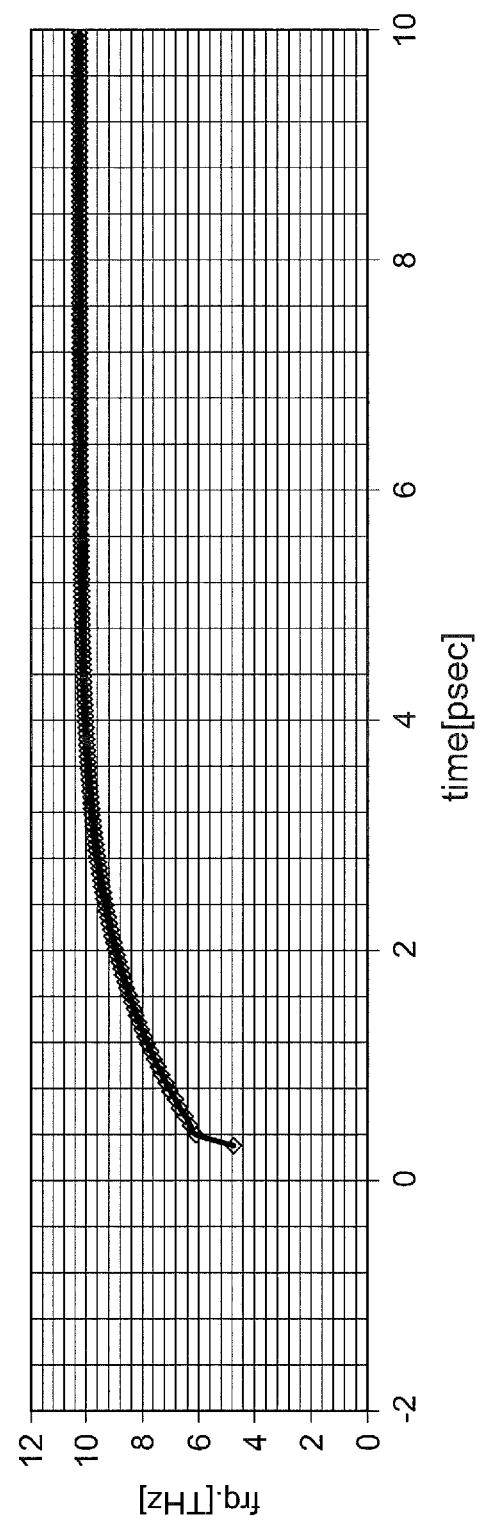
FIG. 16b is a graph representing the calculation result of a rise of oscillation in EXAMPLE 4 of the present invention.

FIG. 16b represents the simulation result of time-dependent change of the oscillation frequency in EXAMPLE 4. The oscillation occurred at about 10 THz in the steady state, and the rise time was 4.8 psec.

COMPARATIVE EXAMPLE 5

Figure 17A:
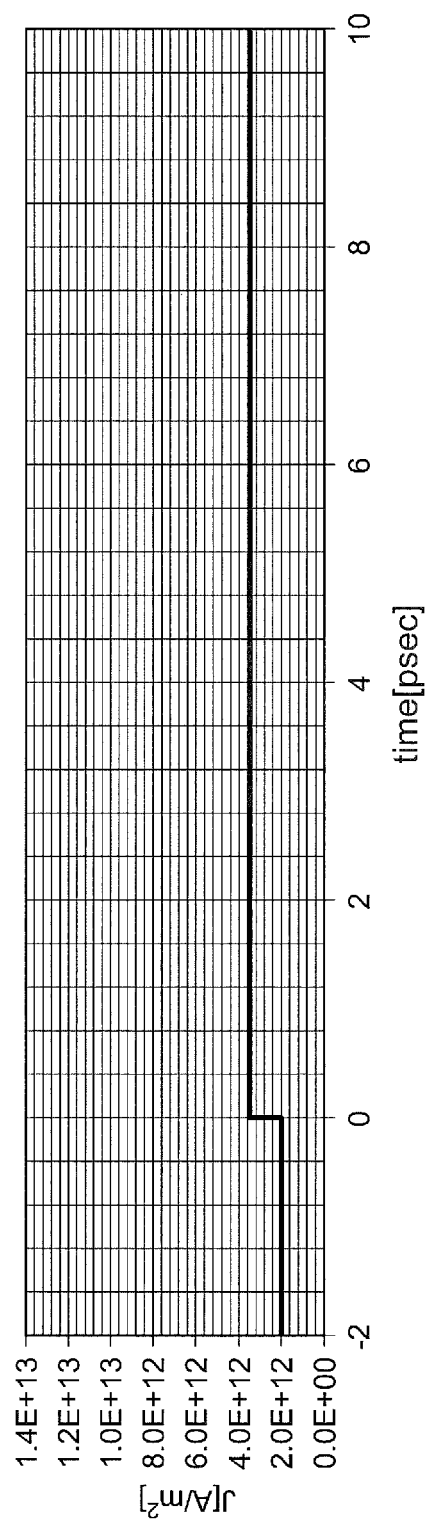
FIG. 17a is a graph representing an applied current density in COMPARATIVE EXAMPLE 5 as compared with the present invention.

The case in which the second step in EXAMPLE 4 is omitted is described for comparison with EXAMPLE 4. In COMPARATIVE EXAMPLE 5, the magnetoresistive effect element is the same as that in EXAMPLE 4. FIG. 17a represents time-dependent change of the current density applied to the magnetoresistive effect element 410. As the first step, a current flowing in the positive direction and having the current density of $1.99 \times 10^{12}$ A/m$^2$ was applied to the magnetoresistive effect element 410 to make the operating point of the magnetoresistive effect element 410 positioned in the region of bistability. Then, a current flowing in the positive direction at $3.50 \times 10^{12}$ A/m$^2$, not less than the critical current density for oscillation, was applied.

Figure 17B:
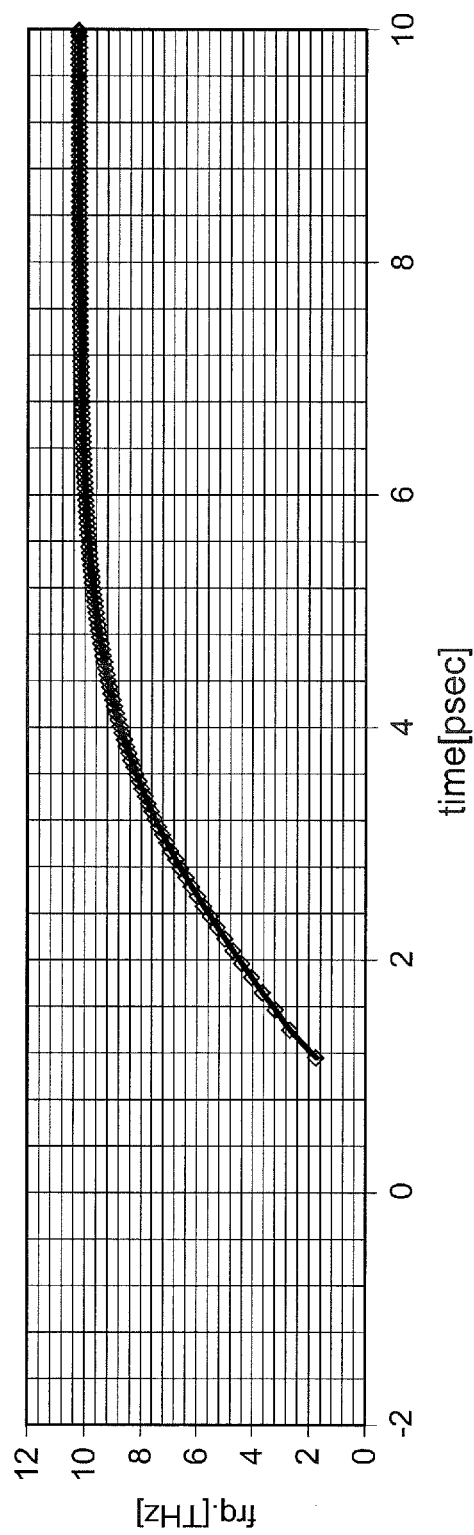
FIG. 17b is a graph representing the calculation result of a rise of oscillation in COMPARATIVE EXAMPLE 5 as compared with the present invention.

FIG. 17b represents the simulation result of time-dependent change of the oscillation frequency in COMPARATIVE EXAMPLE 5. The oscillation occurred at about 10 THz in the steady state, and the rise time was 7 psec.

Comparing the rise times in EXAMPLE 4 and COMPARATIVE EXAMPLE 5, the rise time in EXAMPLE 4 is 4.8 psec, whereas the rise time in COMPARATIVE EXAMPLE 5 is 7 psec. Thus, the rise of the oscillation is faster in EXAMPLE 4.

In addition, comparing the rise times in COMPARATIVE EXAMPLE 3 and EXAMPLE 4 which are in common in point of applying the current to the magnetoresistive effect element 410, as the first step, to make the operating point of the magnetoresistive effect element 410 positioned in the region of bistability, the rise time in COMPARATIVE EXAMPLE 3 is about 6 psec. Thus, the rise of the oscillation in EXAMPLE 4 is faster than in COMPARATIVE EXAMPLE 3.

EXAMPLE 5

EXAMPLE regarding a fall of oscillation in the embodiment of the present invention is described below. In this EXAMPLE, the magnetoresistive effect element is the same as that in EXAMPLE 1.

A fall time is defined as a time from the start of operation for the fall of the oscillation in the magnetoresistive effect oscillator until reaching the static condition. In EXAMPLE 5, later-described EXAMPLES 6 and 7, and later-described COMPARATIVE EXAMPLES 6 and 7, the time of starting the operation for the fall of the oscillation is set to 0 sec.

Figure 18A:
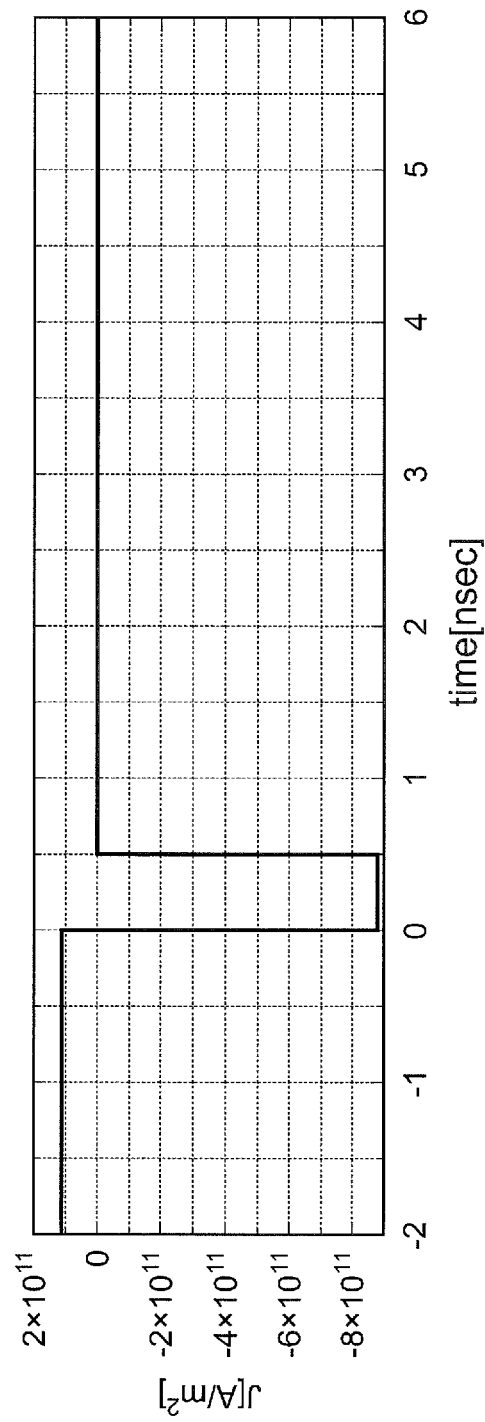
FIG. 18a is a graph representing an applied current density in EXAMPLE 5 of the present invention.

FIG. 18a represents time-dependent change of the current density applied to the magnetoresistive effect element 112 in EXAMPLE 5. In the first step, a current flowing in the positive direction at $1.1 \times 10^{11}$ A/m$^2$ was applied. Then, a current flowing in the negative direction at $8.8 \times 10^{11}$ A/m$^2$ was applied as the second step during a period from 0 nsec to 0.5 nsec. Then, the application of the current was stopped in the third step after 0.5 nsec.

Figure 18B:
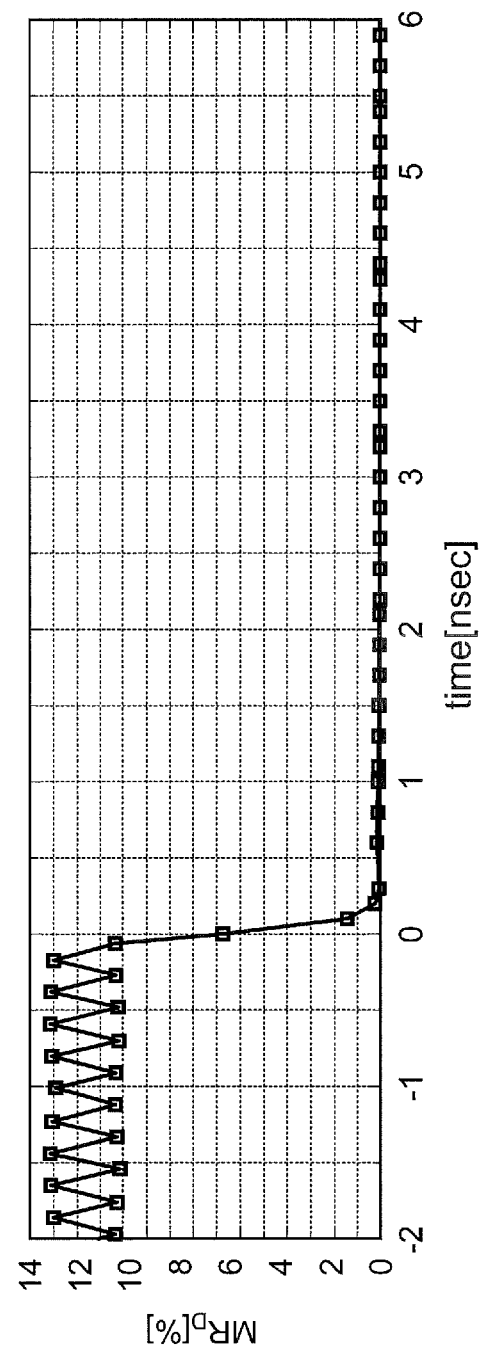
FIG. 18b is a graph representing the calculation result of a fall of oscillation in EXAMPLE 5 of the present invention.

FIG. 18b represents time-dependent change of the dynamics MR ratio of the magnetoresistive effect element 112 in EXAMPLE 5. During the first step, the dynamics MR ratio was 10% or more, and the oscillating condition was held. After 0 nsec, the dynamics MR ratio was abruptly reduced, and the fall time until reaching the static condition was 0.5 nsec.

COMPARATIVE EXAMPLE 6

Figure 19A:
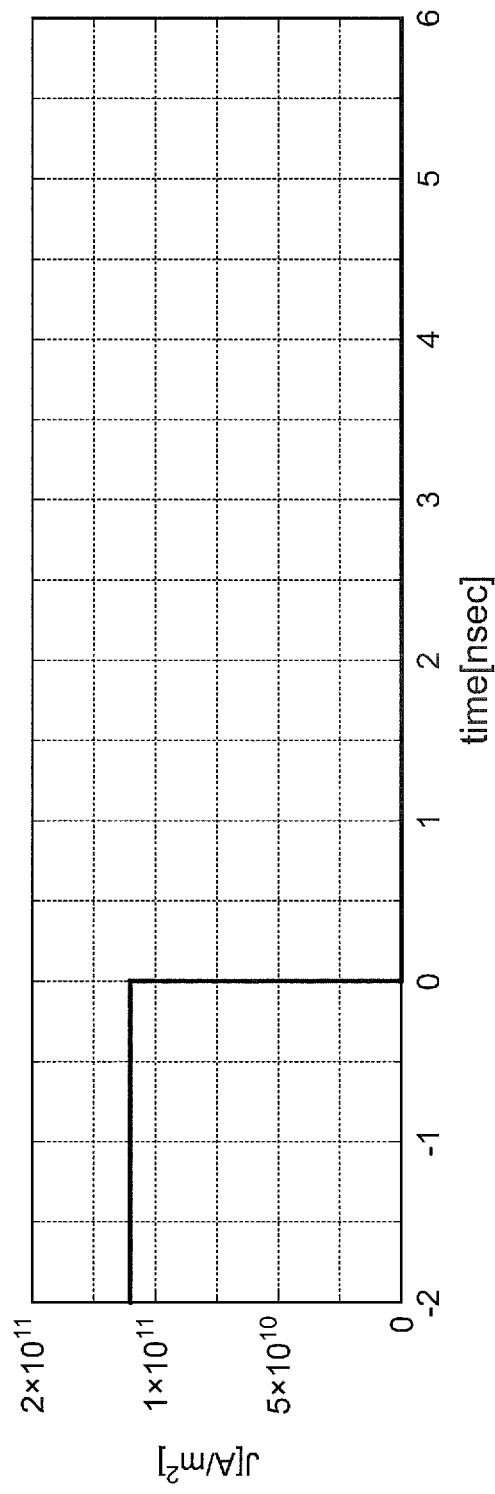
FIG. 19a is a graph representing an applied current density in COMPARATIVE EXAMPLE 6 as compared with the present invention.

This COMPARATIVE EXAMPLE represents dynamics of the fall of the oscillation of the magnetoresistive effect element in the case where the second step of applying the current to the magnetoresistive effect element in EXAMPLE 5 is omitted. The magnetoresistive effect element in this COMPARATIVE EXAMPLE is the same as that in EXAMPLE 5. FIG. 19a represents time-dependent change of the current density applied to the magnetoresistive effect element 112 in COMPARATIVE EXAMPLE 6. As the first step, a current flowing in the positive direction at $1.1 \times 10^{11}$ A/m$^2$ was applied as in EXAMPLE 5. Then, the application of the current was stopped.

Figure 19B:
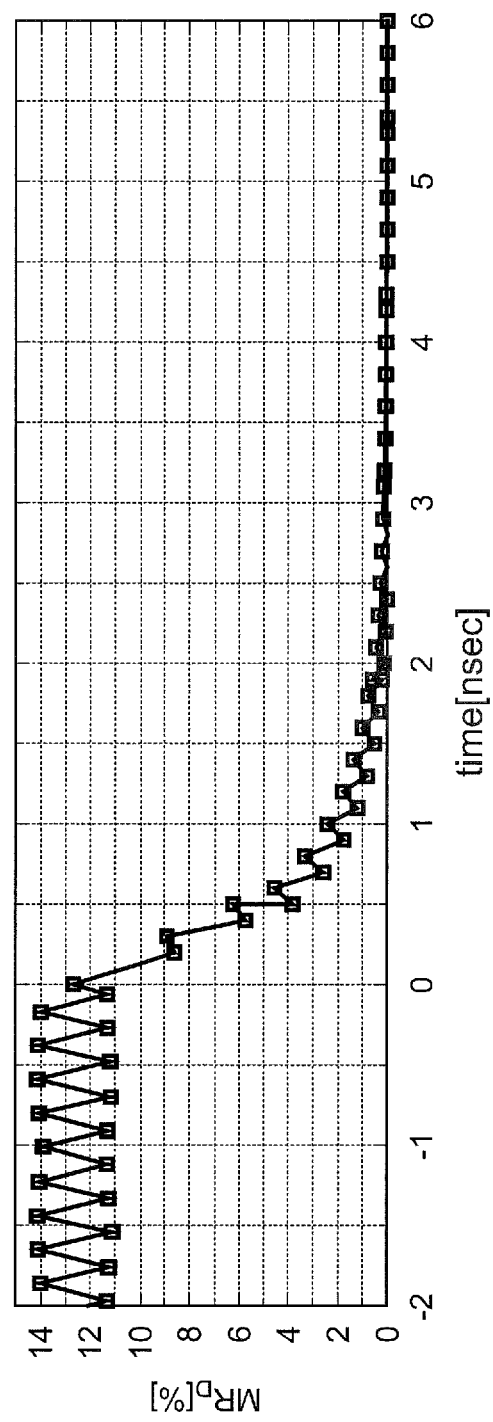
FIG. 19b is a graph representing the calculation result of a fall of oscillation in COMPARATIVE EXAMPLE 6 as compared with the present invention.

FIG. 19b represents time-dependent change of the dynamics MR ratio of the magnetoresistive effect element 112 in COMPARATIVE EXAMPLE 6. Until 0 nsec, the dynamics MR ratio was 10% or more, and the oscillating condition was held. Thereafter, the MR ratio was gradually reduced, and the fall time until reaching the static condition was 4 nsec.

Comparing the fall times of the oscillations in EXAMPLE 5 and COMPARATIVE EXAMPLE 6, the fall time in EXAMPLE 5 is 0.5 nsec, whereas the fall time in COMPARATIVE EXAMPLE 6 is 4 nsec. The reason is as follows. In EXAMPLE 5, since a comparatively large current in the reversed direction is applied to the magnetoresistive effect element 112, the spin-transfer torque acting to stop the oscillation is exerted strongly, and the oscillation is fallen rapidly. On the other hand, in COMPARATIVE EXAMPLE 6, the oscillation is gradually reduced due to the action of the damping term, and a longer time is taken until reaching the static condition. Thus, by employing the magnetoresistive effect oscillator of EXAMPLE 5, the fall of the oscillation can be sped up about 8 times that in the case where the second step is omitted.

EXAMPLE 6

Another EXAMPLE regarding a fall of oscillation in the embodiment of the present invention is described below. In EXAMPLE 6, the magnetoresistive effect element is the same NCMR element as that in EXAMPLE 2.

In EXAMPLE 6, a fall time is defined as follows. The fall time is a time from the start of operation for the fall of the oscillation in the magnetoresistive effect oscillator until a maximum point in time at which a z-component of an average value of the magnetization vector in the ferromagnetic nano-contact intersects 0.

Figure 20A:
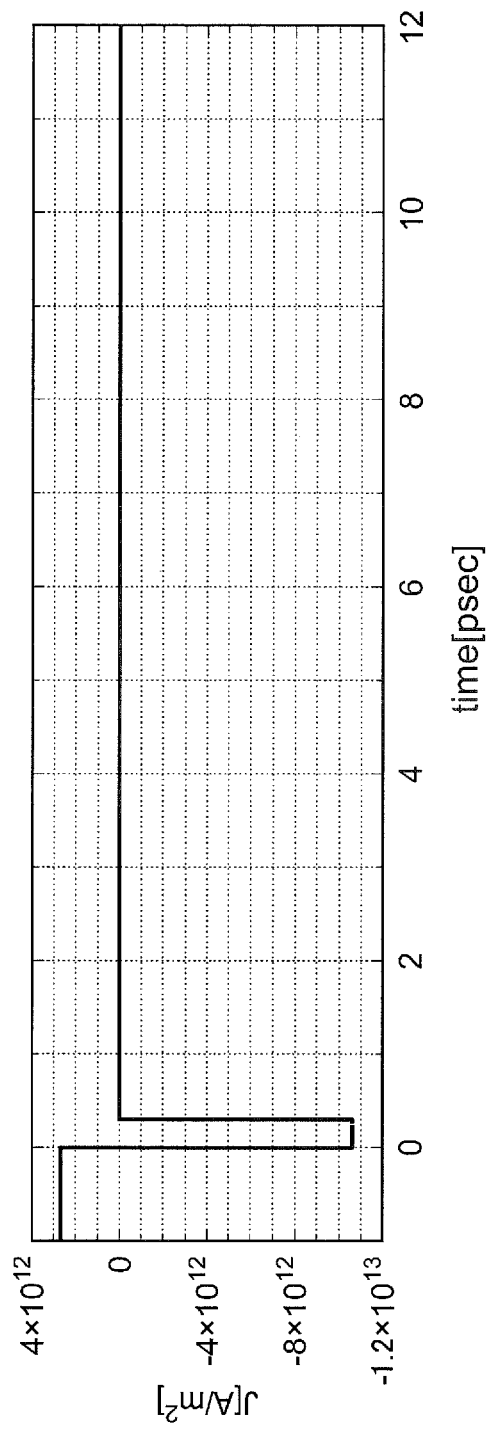
FIG. 20a is a graph representing an applied current density in EXAMPLE 6 of the present invention.

The operation of the current source to stop the oscillation of the magnetoresistive effect element 410 is described below. FIG. 20a is a graph representing time-dependent change of the current density applied to the magnetoresistive effect element 410. As the first step, a current flowing in the positive direction and having the critical current density for oscillation, i.e., $2.66 \times 10^{12}$ A/m$^2$, was applied to develop a condition oscillating at a constant frequency. Then, in the oscillating condition, a current flowing in the negative direction at $10.6 \times 10^{12}$ A/m$^2$ was applied for 0.5 psec as the second step. Then, the application of the current was stopped as the third step.

Figure 20B:
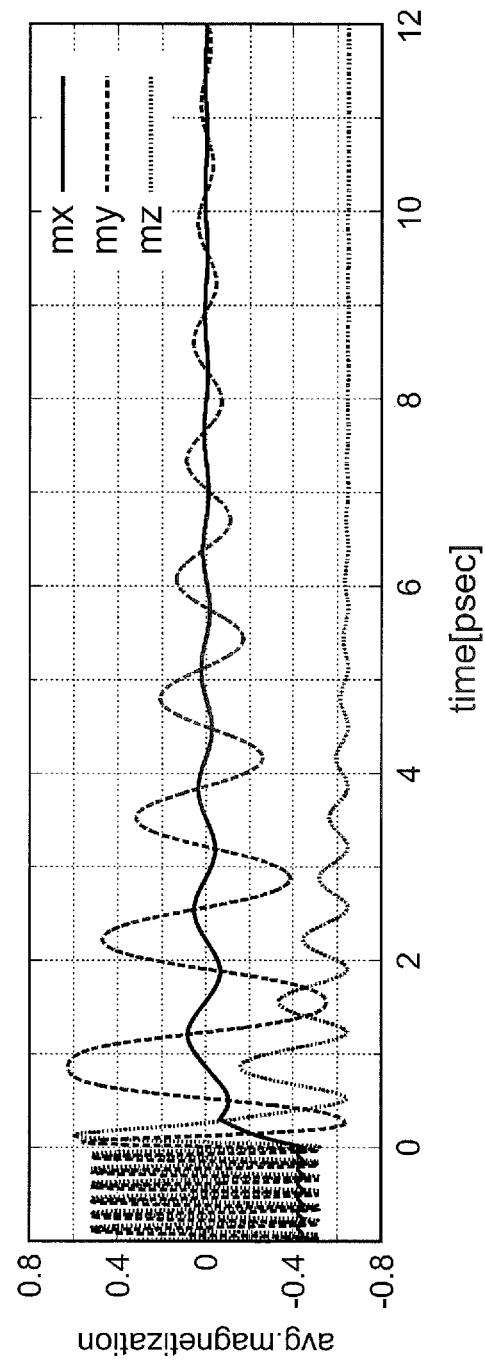
FIG. 20b is a graph representing the calculation result of a fall of oscillation in EXAMPLE 6 of the present invention.

FIG. 20b represents the calculation result of time-dependent change of the average value of the magnetization vector in the ferromagnetic nano-contact. After 0 sec, a z-component $m_z$ of the average value of the magnetization vector does not intersect 0, and the Neel wall is substantially maintained. Therefore, resistance change does not occur. The reason is presumably as follows. Because the current in the negative direction is applied to the magnetoresistive effect element 410 such that the spin-transfer torque in the reversed direction acts on the magnetoresistive effect element 410, a force acting to turn the magnetic domain wall in the reversed direction is exerted, and rotation of the magnetic domain wall is stopped abruptly.

COMPARATIVE EXAMPLE 7

Figure 21A:
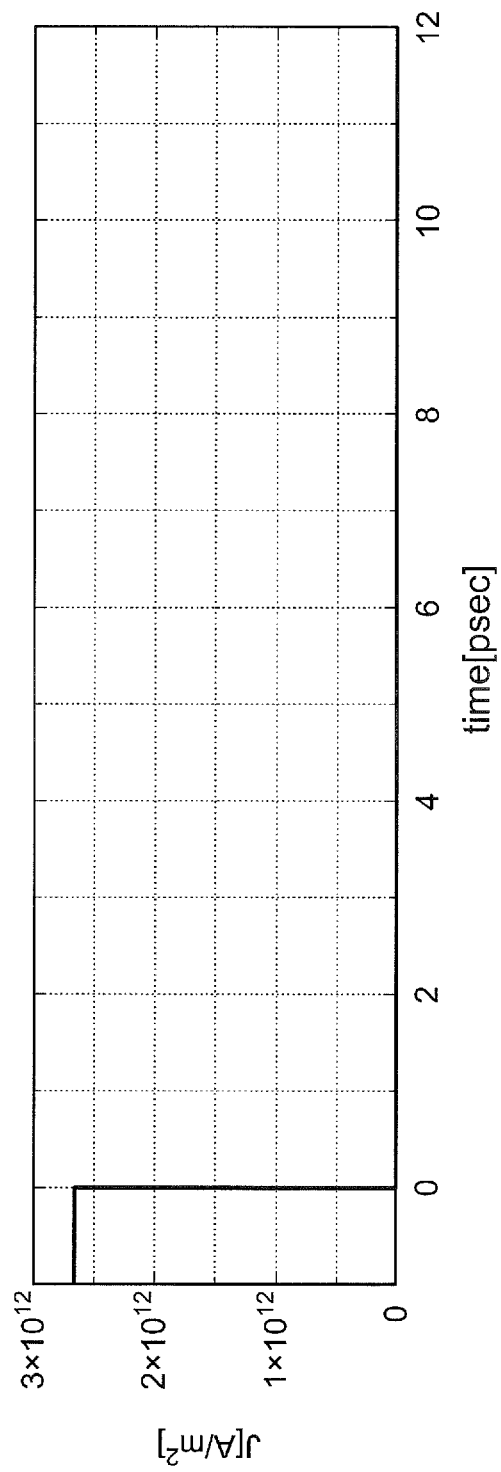
FIG. 21a is a graph representing an applied current density in COMPARATIVE EXAMPLE 7 as compared with the present invention.

COMPARATIVE EXAMPLE in which the second step in EXAMPLE 6 is omitted is described below. The magnetoresistive effect element in this COMPARATIVE EXAMPLE is the same as that in EXAMPLE 6. FIG. 21a represents time-dependent change of the applied current density in COMPARATIVE EXAMPLE 7. In the first step, as in EXAMPLE 6, a current flowing in the positive direction and having the critical current density for oscillation, i.e., $2.66 \times 10^{12}$ A/m$^2$, was applied to the magnetoresistive effect element 410. Then, the application of the current was stopped.

Figure 21B:
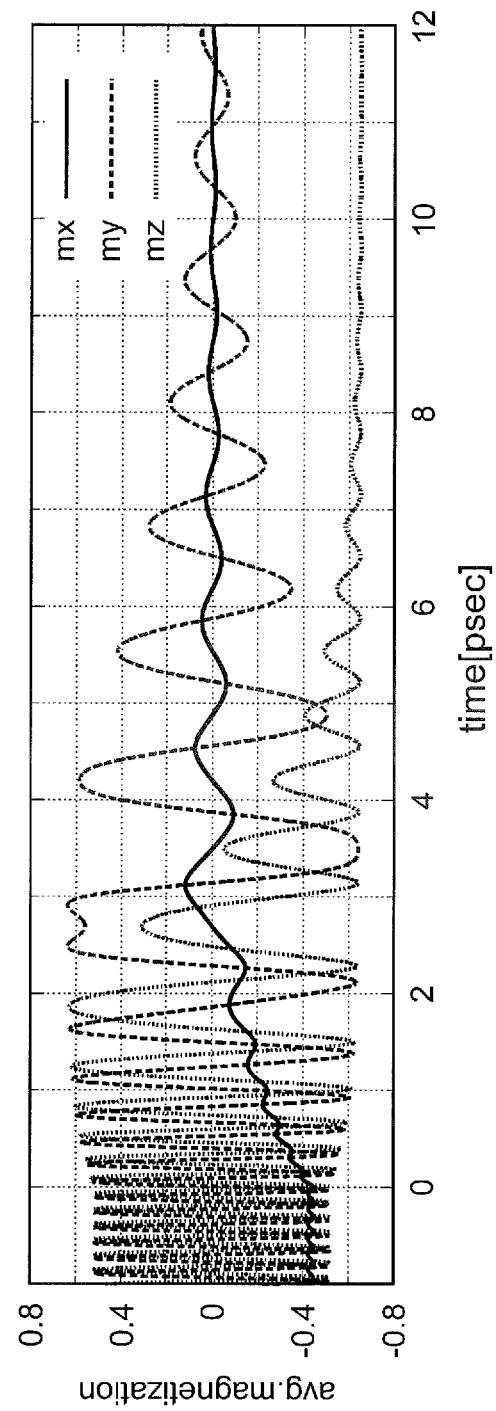
FIG. 21b is a graph representing the calculation result of a fall of oscillation in COMPARATIVE EXAMPLE 7 as compared with the present invention.

FIG. 21b represents the calculation result of time-dependent change of the average value of the magnetization vector in the ferromagnetic nano-contact of the magnetoresistive effect element 410 in COMPARATIVE EXAMPLE 7. After 0 sec, the average value $m_z$ of the z-component of the magnetization vector and the average value $m_y$ of the y-component of the magnetization vector intersected 0 until about 3 psec, and the Neel wall and the Bloch wall were alternately transited from one to the other. In other words, the oscillation was sustained. After 3 psec, $m_z$ did not intersect 0, and the Neel wall was substantially maintained. Thus, the oscillation disappeared. Accordingly, the fall time of the oscillation in COMPARATIVE EXAMPLE 7 was 3 psec.

Comparing the fall times in EXAMPLE 6 and COMPARATIVE EXAMPLE 7, the fall time in EXAMPLE 6 is 0 sec, whereas the fall time in COMPARATIVE EXAMPLE 7 is 3 psec. Accordingly, an effect of speeding up the fall of the oscillation is expected by employing the magnetoresistive effect oscillator of EXAMPLE 6.

EXAMPLE 7

EXAMPLE regarding a rise and a fall of oscillation in the embodiment of the present invention is described below in connection with a more specific example of pulse current generating means. As illustrated in FIG. 2b, the magnetoresistive effect oscillator 200 includes the magnetoresistive effect element 112 and the current applying unit 205. The current applying unit 205 includes the inductor 201, the resistance 202, and the current source 204. The magnetoresistive effect element 112 and the inductor 201 are connected in parallel, and the inductor 201 and the resistance 202 are connected in series. The magnetoresistive effect element 112 is the same as that in EXAMPLE 1. A resistance value of the magnetoresistive effect element 112 is set to 50Ω, inductance of the inductor 201 is set to 30 nH, and the resistance 202 is set to 7.143Ω.

Figure 22A:
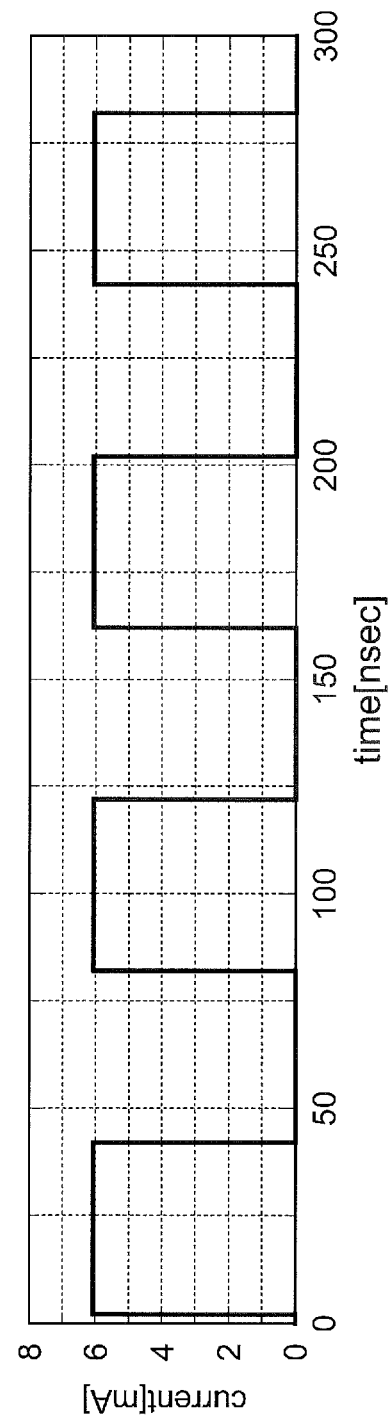
FIG. 22a is a graph representing an applied current in EXAMPLE 7 of the present invention.

The current source 204 is connected between the first electrode 110 and the second electrode 111, and a current is applied in the direction perpendicular to the film surface of the magnetoresistive effect element 112. FIG. 22a represents time-dependent change of the current generated by the current source 204. The current source 204 generates a pulse current through the operation of applying a current of 6 mA for 40 nsec, and then stopping the application of the current for 40 nsec. The current varying in such a way is utilized in high-speed communications, and it corresponds to, e.g., a signal in accordance with the NRZ (Non Return To Zero) technique that represents information 1 when a current is applied, and information 0 when no current is applied.

Figure 22B:
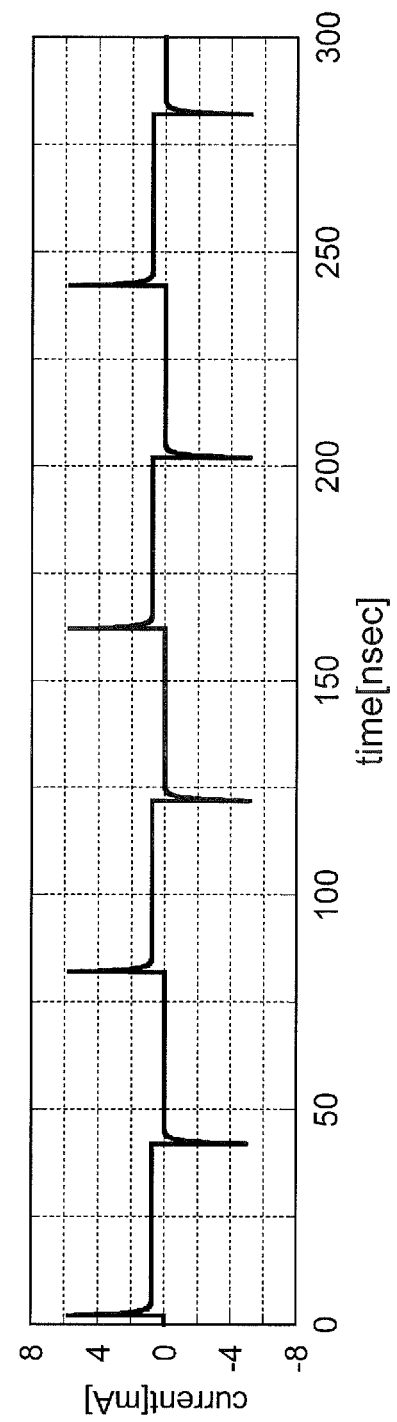
FIG. 22b is a graph representing the calculation result of a rise of oscillation in EXAMPLE 7 of the present invention.

FIG. 22b represents time-dependent change of the current applied to the magnetoresistive effect element 112 in EXAMPLE 7. At timing of starting the application of the current, a pulse of about 6 mA was applied for several nanoseconds due to an electromotive force generated in the inductor 201. Thereafter, the electromotive force disappeared, and the current was reduced to 0.7 mA and then stabilized. At timing of stopping the application of the current, a current of about −6 mA flowed through the magnetoresistive effect element for several nanoseconds due to an electromotive force generated in the inductor 201. Thereafter, the current was reduced to zero. With the above-described circuit operation, it is possible to produce both the current to perform the operation for the rise of the oscillation in the magnetoresistive effect element 112 in EXAMPLE 1, and the current to perform the operation for the fall of the oscillation in the magnetoresistive effect element 112 in EXAMPLE 5.

Figure 22C:
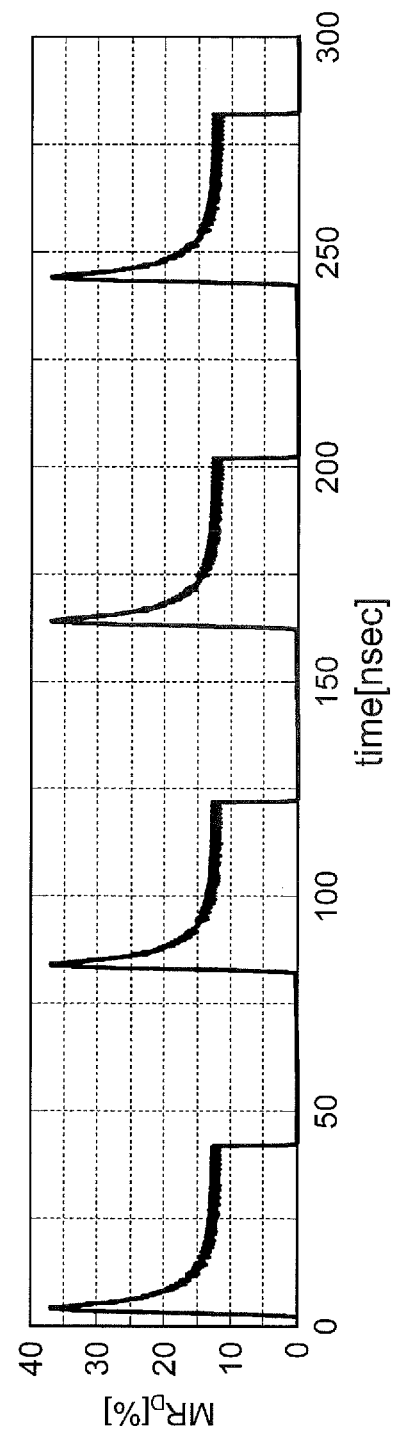
FIG. 22c is a graph representing the calculation result of a fall of oscillation in EXAMPLE 7 of the present invention.

Furthermore, the magnetoresistive effect oscillator of EXAMPLE 7 can be utilized in high-speed wireless communications. FIG. 22c represents time-dependent change of the dynamics MR ratio when the current illustrated in FIG. 22b is applied to the magnetoresistive effect element 112. When the current is applied, resistance causes vibration. Namely, an RF signal is generated. On the other hand, when the current is not applied, resistance change is not caused and an RF signal is not generated. Accordingly, by inputting a signal in accordance with the NRZ technique to the magnetoresistive effect element 112, the signal can be converted to an RF signal, and the NRZ signal can be modulated at several tens Mbps in EXAMPLE 7.

Thus, with the magnetoresistive effect oscillator of the present invention, the magnetoresistive effect element can be operated to oscillate following a rise and a fall of a signal in high-speed communications, and practical application to high-speed wireless communications can be realized.

The magnetoresistive effect oscillator according to the present invention can be utilized in high-speed wireless communications and so on.

REFERENCE SIGNS LIST 100, 200, 400 . . . magnetoresistive effect oscillators, 101, 102, 401, 402 . . . magnetic layers, 103 . . . spacer layer, 112, 410 . . . magnetoresistive effect elements, 106 . . . conduction electron, 110, 111, 407, 408 . . . electrodes, 114, 205 . . . current applying units, 115 . . . control unit, 113, 204 . . . current sources, 201 . . . inductor, 202 . . . resistance, 403 . . . insulating portion, 404 . . . ferromagnetic nano-contact region, 500 . . . calculation model of ferromagnetic nano-contact, 2301 . . . region where only oscillating condition is stable, 2302 . . . region of bistability, 2303, 2304 . . . regions where only stationary condition is stable

What is claimed is:

1. A magnetoresistive effect oscillator comprising:
a magnetoresistive effect element including a first magnetic layer, a second magnetic layer, and a spacer layer sandwiched between the first magnetic layer and the second magnetic layer; and
a current applying unit that applies a current to the magnetoresistive effect element to make the magnetoresistive effect element oscillate at a predetermined oscillation frequency,
wherein, starting from a state of applying a current having a first current density to the magnetoresistive effect element and holding the magnetoresistive effect element in an oscillating condition, the current applying unit applies a current, which has a second current density and flows in a direction reversed to a direction of the current having the first current density, to the magnetoresistive effect element such that oscillation of the magnetoresistive effect element disappears.

2. A magnetoresistive effect oscillator comprising:
a magnetoresistive effect element including a first magnetic layer, a second magnetic layer, and a spacer layer sandwiched between the first magnetic layer and the second magnetic layer; and
a current applying unit that applies a current to the magnetoresistive effect element to make the magnetoresistive effect element oscillate at a predetermined oscillation frequency,
wherein the current applying unit applies a current, which has a first current density larger than a critical current density for oscillation of the magnetoresistive effect element, to the magnetoresistive effect element,
and then applies a current having a second current density, which is less than the first current density and not less than the critical current density for oscillation, to the magnetoresistive effect element such that the magnetoresistive effect element oscillates at the predetermined frequency, a direction of the current having the second current density being same as a direction of the current having the first current density, and
starting from a state of applying the current having the second current density to the magnetoresistive effect element and holding the magnetoresistive effect element in an oscillating condition, the current applying unit applies a current, which has a fourth current density and flows in a direction reversed to the direction of the current having the second current density, to the magnetoresistive effect element such that oscillation of the magnetoresistive effect element disappears.

* * * * *